United States Patent
Novak, III et al.

(10) Patent No.: US 12,422,802 B2
(45) Date of Patent: Sep. 23, 2025

(54) POWER CONTROL FOR AN AEROSOL DELIVERY DEVICE

(71) Applicant: RAI STRATEGIC HOLDINGS, INC., Winston-Salem, NC (US)

(72) Inventors: Charles Jacob Novak, III, Winston-Salem, NC (US); Sean A. Daugherty, Yadkinville, NC (US); Michael Ryan Galloway, Winston-Salem, NC (US); Jason L. Wood, Lexington, NC (US); Matthew Ferguson, Cary, NC (US); Austin Carpenter, Cary, NC (US); Wilson Christopher Lamb, Hillsborough, NC (US); Raymond Charles Henry, Jr., Green Spring Cove, FL (US)

(73) Assignee: RAI STRATEGIC HOLDINGS, INC., Winston-Salem, NC (US)

( * ) Notice: Subject to any disclaimer, the term of this patent is extended or adjusted under 35 U.S.C. 154(b) by 0 days.

(21) Appl. No.: 18/152,676

(22) Filed: Jan. 10, 2023

(65) Prior Publication Data
US 2023/0148281 A1    May 11, 2023

Related U.S. Application Data

(63) Continuation of application No. 16/669,031, filed on Oct. 30, 2019, now Pat. No. 11,592,793.
(Continued)

(51) Int. Cl.
A24F 40/50    (2020.01)
G01L 13/00    (2006.01)
(Continued)

(52) U.S. Cl.
CPC .............. G05B 15/02 (2013.01); A24F 40/50 (2020.01); G01L 13/00 (2013.01); H03K 7/08 (2013.01); *A24F 40/10* (2020.01)

(58) Field of Classification Search
CPC ......... G05B 15/02; G05B 11/28; A24F 40/50; A24F 40/10; A24F 40/48; A24F 40/51;
(Continued)

(56) References Cited

U.S. PATENT DOCUMENTS 2,057,353 A    10/1936 Whittemore, Jr.
2,104,266 A    1/1938 McCormick
(Continued)

FOREIGN PATENT DOCUMENTS

CN    1541577    11/2004
CN    2719043    8/2005
(Continued)

OTHER PUBLICATIONS

Office Action issued in corresponding Japanese Patent Application No. 2021-527163, dated Oct. 17, 2023.
(Continued)

*Primary Examiner* — David J Bolduc
(74) *Attorney, Agent, or Firm* — Womble Bond Dickinson (US) LLP

(57) ABSTRACT

An aerosol delivery device is provided. The aerosol delivery device includes a power source, an aerosol production component, a sensor to produce measurements of atmospheric air pressure in an air flow path through at least one housing, and a switch coupled to and between the power source and the aerosol production component. The aerosol delivery device also includes processing circuitry that determines a difference between the measurements of atmospheric air pressure and a reference atmospheric air pressure. Only when the difference is at least a threshold difference,
(Continued)

the processing circuitry outputs a signal to cause the switch to switchably connect and disconnect an output voltage from the power source to the aerosol production component to adjust power provided to the aerosol production component to a power target that is variable according to a predetermined relationship between the difference and the power target.

14 Claims, 18 Drawing Sheets

Related U.S. Application Data

(60) Provisional application No. 62/911,727, filed on Oct. 7, 2019, provisional application No. 62/769,296, filed on Nov. 19, 2018.

(51) Int. Cl.
*G05B 15/02* (2006.01)
*H03K 7/08* (2006.01)
*A24F 40/10* (2020.01)

(58) Field of Classification Search
CPC ....... G01L 13/00; H03K 7/08; H02M 1/0003; H05B 1/0202
See application file for complete search history.

(56) References Cited

U.S. PATENT DOCUMENTS

| | | | |
|---|---|---|---|
| 3,200,819 A | 8/1965 | Gilbert | |
| 4,922,901 A * | 5/1990 | Brooks | A61M 16/109 131/273 |
| 4,945,928 A * | 8/1990 | Rose | B82Y 5/00 131/273 |
| 4,947,875 A * | 8/1990 | Brooks | A61M 15/00 131/194 |
| 5,043,560 A | 8/1991 | Masreliez | |
| 5,060,671 A | 10/1991 | Counts et al. | |
| 5,093,894 A | 3/1992 | Deevi et al. | |
| 5,894,841 A | 4/1999 | Voges | |
| 6,125,853 A | 10/2000 | Susa et al. | |
| 6,155,268 A | 12/2000 | Takeuchi | |
| 7,117,867 B2 | 10/2006 | Cox et al. | |
| 7,832,410 B2 | 11/2010 | Hon | |
| 8,314,591 B2 | 11/2012 | Terry et al. | |
| 8,365,742 B2 | 2/2013 | Hon | |
| 8,499,766 B1 | 8/2013 | Newton | |
| 8,528,569 B1 | 9/2013 | Newton | |
| 8,833,364 B2 | 9/2014 | Buchberger | |
| 9,220,304 B2 | 12/2015 | Greim | |
| 9,462,831 B2 | 10/2016 | Liu | |
| 9,814,262 B2 | 11/2017 | Peleg et al. | |
| 9,814,263 B2 | 11/2017 | Cochand et al. | |
| 9,877,508 B2 | 1/2018 | Kane | |
| 9,949,507 B2 | 4/2018 | Flick | |
| 9,986,760 B2 * | 6/2018 | Macko | A24F 40/46 |
| 10,015,990 B2 | 7/2018 | Mironov | |
| 10,028,537 B1 | 7/2018 | Hawes et al. | |
| 10,058,125 B2 | 8/2018 | Worm et al. | |
| 10,070,662 B2 * | 9/2018 | Gorilovsky | F22B 37/38 |
| 10,080,851 B2 | 9/2018 | Davidson et al. | |
| 10,081,531 B2 * | 9/2018 | Murison | B67D 7/42 |
| 10,085,481 B2 | 10/2018 | Verleur et al. | |
| 10,091,839 B2 * | 10/2018 | Murison | A24F 40/65 |
| 10,092,037 B2 | 10/2018 | Tucker et al. | |
| 10,104,913 B2 | 10/2018 | Lau et al. | |
| 10,117,463 B2 | 11/2018 | Thomas | |
| 10,117,467 B2 | 11/2018 | Hawes et al. | |
| 10,159,279 B2 | 12/2018 | Lord et al. | |
| 2005/0016550 A1 | 1/2005 | Katase | |
| 2006/0047368 A1 * | 3/2006 | Maharajh | F22B 37/38 128/200.14 |
| 2006/0196518 A1 | 9/2006 | Hon | |
| 2008/0092912 A1 | 4/2008 | Robinson et al. | |
| 2009/0095311 A1 | 4/2009 | Hon | |
| 2009/0126745 A1 | 5/2009 | Hon | |
| 2009/0151717 A1 | 6/2009 | Bowen et al. | |
| 2009/0188490 A1 | 7/2009 | Hon | |
| 2009/0272379 A1 | 11/2009 | Thorens et al. | |
| 2009/0304558 A1 | 12/2009 | Patton et al. | |
| 2009/0320863 A1 | 12/2009 | Fernando et al. | |
| 2011/0094523 A1 | 4/2011 | Thorens et al. | |
| 2011/0126848 A1 | 6/2011 | Zuber et al. | |
| 2011/0155718 A1 | 6/2011 | Greim et al. | |
| 2011/0168194 A1 | 7/2011 | Hon | |
| 2011/0265806 A1 | 11/2011 | Alarcon et al. | |
| 2012/0000462 A1 | 1/2012 | Edwards et al. | |
| 2013/0037041 A1 | 2/2013 | Worm et al. | |
| 2013/0042865 A1 | 2/2013 | Monsees et al. | |
| 2013/0104916 A1 | 5/2013 | Bellinger et al. | |
| 2013/0306084 A1 | 11/2013 | Flick | |
| 2013/0319435 A1 | 12/2013 | Flick | |
| 2014/0000638 A1 | 1/2014 | Sebastian et al. | |
| 2014/0096781 A1 | 4/2014 | Sears et al. | |
| 2014/0096782 A1 | 4/2014 | Ampolini et al. | |
| 2014/0144429 A1 | 5/2014 | Wensley et al. | |
| 2014/0253144 A1 | 9/2014 | Novak, III et al. | |
| 2014/0261408 A1 | 9/2014 | DePiano et al. | |
| 2014/0261486 A1 | 9/2014 | Potter et al. | |
| 2014/0261487 A1 | 9/2014 | Chapman et al. | |
| 2014/0270727 A1 | 9/2014 | Ampolini et al. | |
| 2014/0366898 A1 | 12/2014 | Monsees et al. | |
| 2015/0020832 A1 | 1/2015 | Greim et al. | |
| 2015/0150308 A1 | 6/2015 | Monsees et al. | |
| 2015/0164142 A1 | 6/2015 | Li et al. | |
| 2015/0189918 A1 * | 7/2015 | Liu | H05B 3/03 131/329 |
| 2015/0208729 A1 | 7/2015 | Monsees et al. | |
| 2015/0245661 A1 * | 9/2015 | Milin | A24F 40/40 131/329 |
| 2015/0250232 A1 | 9/2015 | Hon | |
| 2015/0282527 A1 | 10/2015 | Henry, Jr. | |
| 2015/0313287 A1 | 11/2015 | Verleur et al. | |
| 2015/0335074 A1 * | 11/2015 | Leung | H05B 1/0297 131/328 |
| 2015/0359263 A1 | 12/2015 | Bellinger | |
| 2016/0157524 A1 | 6/2016 | Bowen et al. | |
| 2016/0174611 A1 * | 6/2016 | Monsees | A24F 40/50 392/386 |
| 2016/0242466 A1 * | 8/2016 | Lord | A24F 40/50 |
| 2016/0252980 A1 | 9/2016 | Park et al. | |
| 2016/0331030 A1 | 11/2016 | Ampolini et al. | |
| 2016/0374397 A1 * | 12/2016 | Jordan | G01R 31/66 131/329 |
| 2017/0027226 A1 | 2/2017 | Mironov et al. | |
| 2017/0042227 A1 * | 2/2017 | Gavrielov | A24F 40/51 |
| 2017/0071256 A1 | 3/2017 | Verleur et al. | |
| 2017/0095005 A1 * | 4/2017 | Monsees | H05B 3/04 |
| 2017/0112196 A1 | 4/2017 | Sur et al. | |
| 2017/0135401 A1 | 5/2017 | Dickens | |
| 2017/0135404 A1 | 5/2017 | Reevell | |
| 2017/0135405 A1 | 5/2017 | Reevell | |
| 2017/0135406 A1 | 5/2017 | Reevell | |
| 2017/0143042 A1 | 5/2017 | Batista et al. | |
| 2017/0146005 A1 * | 5/2017 | Edelen | A24F 40/50 |
| 2017/0215485 A1 | 8/2017 | Zitzke | |
| 2017/0231281 A1 | 8/2017 | Hatton et al. | |
| 2017/0231282 A1 | 8/2017 | Hatton et al. | |
| 2017/0251728 A1 | 9/2017 | Peleg et al. | |
| 2017/0273769 A1 | 9/2017 | Paamand | |
| 2017/0290370 A1 * | 10/2017 | Garthaffner | A61M 11/042 |
| 2017/0325289 A1 | 11/2017 | Liu | |
| 2017/0340011 A1 | 11/2017 | Batista | |
| 2017/0340012 A1 | 11/2017 | Mironov et al. | |
| 2017/0340019 A1 * | 11/2017 | Plunkett | A24F 40/46 |
| 2017/0347707 A1 * | 12/2017 | Xiang | G06F 16/26 |
| 2017/0347711 A1 | 12/2017 | Litten et al. | |
| 2017/0347712 A1 | 12/2017 | Singh | |
| 2017/0367410 A1 | 12/2017 | Hon | |
| 2017/0368273 A1 * | 12/2017 | Rubin | A61M 16/0093 |
| 2018/0000157 A1 | 1/2018 | Batista et al. | |

(56) References Cited

U.S. PATENT DOCUMENTS

| | | | |
|---|---|---|---|
| 2018/0000160 A1 | 1/2018 | Taschner et al. |
| 2018/0014575 A1 | 1/2018 | Fursa |
| 2018/0020731 A1 | 1/2018 | Rasmussen et al. |
| 2018/0020736 A1 | 1/2018 | Silvestrini |
| 2018/0035717 A1 | 2/2018 | Batista |
| 2018/0042306 A1 | 2/2018 | Atkins et al. |
| 2018/0043114 A1 | 2/2018 | Bowen et al. |
| 2018/0070648 A1 | 3/2018 | Monsees et al. |
| 2018/0077967 A1 | 3/2018 | Hatton et al. |
| 2018/0084608 A1 | 3/2018 | Bernauer et al. |
| 2018/0084831 A1 | 3/2018 | Mironov |
| 2018/0103685 A1 | 4/2018 | Yener |
| 2018/0132525 A1 | 5/2018 | Patil et al. |
| 2018/0132530 A1 | 5/2018 | Rogers et al. |
| 2018/0140009 A1 | 5/2018 | Sur et al. |
| 2018/0140019 A1 | 5/2018 | Guo et al. |
| 2018/0177230 A1 | 6/2018 | Hawes et al. |
| 2018/0206557 A1 | 7/2018 | Peleg et al. |
| 2018/0213850 A1 | 8/2018 | Brinkley et al. |
| 2018/0235282 A1 | 8/2018 | Gao et al. |
| 2018/0242643 A1 | 8/2018 | Silvestrini et al. |
| 2018/0280637 A1 | 10/2018 | Mayle et al. |
| 2018/0295888 A1 | 10/2018 | Newcomb et al. |
| 2018/0296777 A1 | 10/2018 | Terry et al. |
| 2018/0303161 A1 | 10/2018 | Bilat |
| 2018/0325182 A1 | 11/2018 | Zitzke et al. |
| 2019/0274354 A1 | 9/2019 | Sur et al. |
| 2019/0321570 A1* | 10/2019 | Rubin | A61M 16/209 |
| 2019/0350257 A1* | 11/2019 | Sur | H04B 5/0031 |
| 2019/0364957 A1* | 12/2019 | Fu | A61M 11/042 |
| 2019/0373679 A1* | 12/2019 | Fu | A24F 7/00 |
| 2019/0387794 A1 | 12/2019 | Yan et al. |
| 2020/0022417 A1* | 1/2020 | Atkins | A61M 15/0063 |

FOREIGN PATENT DOCUMENTS

| | | |
|---|---|---|
| CN | 201379072 | 1/2010 |
| CN | 106575877 A | 4/2017 |
| CN | 107280072 A | 10/2017 |
| CN | 207461397 U | 6/2018 |
| CN | 108685181 A | 10/2018 |
| CN | 113613518 A | 11/2021 |
| CO | 13156476 | 1/2016 |
| DE | 102009029768 A1 | 1/2011 |
| DE | 202012101880 U1 | 7/2012 |
| EP | 1 618 803 | 1/2006 |
| EP | 3597054 A1 | 1/2020 |
| EP | 3813910 A0 | 5/2021 |
| GB | 201602831 | 4/2016 |
| GB | 201614817 | 10/2016 |
| GB | 2542270 A | 3/2017 |
| JP | 2012157348 A | 8/2012 |
| WO | WO 2004/080216 | 9/2004 |
| WO | WO 2005/099494 | 10/2005 |
| WO | WO 2007/131449 | 11/2007 |
| WO | 2013098397 A2 | 7/2013 |
| WO | 2014054035 A1 | 4/2014 |
| WO | WO 2016/026811 | 2/2016 |
| WO | 2016094225 A1 | 6/2016 |
| WO | WO 2017/051006 | 9/2016 |
| WO | WO 2016200382 | 12/2016 |
| WO | WO 2016/207442 | 5/2017 |
| WO | 2017144703 A1 | 8/2017 |
| WO | WO 2017/147560 | 8/2017 |
| WO | 2018175543 A1 | 9/2017 |
| WO | 2018031143 A1 | 2/2018 |
| WO | WO 2018/047092 | 3/2018 |
| WO | 2018107018 A1 | 6/2018 |
| WO | WO 2018/138688 | 8/2018 |
| WO | WO 2018/167166 | 9/2018 |
| WO | WO 2018/202732 | 11/2018 |
| WO | 2018198152 A1 | 11/2019 |
| WO | 2020003305 A1 | 1/2020 |

OTHER PUBLICATIONS

Notice on Grant of Patent Right for Invention issued May 28, 2024 in corresponding Chinese Application No. 201980089584.5.

Wikipedia entry for "Electronic Cigarette" as archived on Nov. 17, 2018.

The electronic cigarette: an alternative to tobacco?, Jean-Francois Etter; CreateSpace Independent Publishing Platform; 1st edition (Feb. 4, 2013).

Transactions of the Royal Society of Edinburgh, vol. XVIII, containing the Makerstoun Magnetical and Meteorological Observations for 1844, Robert Grant & Sons, pp. 419-424.

Wikipedia entry for "Pulse-width modulation" as archived on Oct. 8, 2018.

Evaluation of Electronic Cigarette Use (Vaping) Topography and Estimation of Liquid Consumption; Implications for Research Protocol Standards Definition and for Public Health Authorities' Regulation, Int. J. Environ Res Public Health. Jun. 2013; 10(6): 2500-2514, Abstract.

Communication of a Notice of Opposition to a European Patent filed in corresponding European Patent Application No. 19798747.2, U.S. Pat. No. 3,883,413, dated Sep. 27, 2023.

Communication of a notice of opposition and request to file observations issued in corresponding European Patent Application No. 19798747.2, U.S. Pat. No. 3,883,413, dated Oct. 4, 2023.

Brief Communication regarding Opposition proceedings, Summons to attend Oral Proceedings issued in corresponding European Patent Application No. 19798747.2, U.S. Pat. No. 3,883,413, dated May 31, 2024.

Final Written Submissions in Opposition proceedings filed Nov. 29, 2024, in corresponding European Patent Application No. 19798747.2, U.S. Pat. No. 3,883,413.

Brief Communication with Letter from the Opponent in corresponding European Patent Application No. 19798747.2, U.S. Pat. No. 3,883,413, dated Jan. 30, 2025.

Final Notice of Preliminary Rejection mailed May 15, 2025, in corresponding Korean patent application No. 2021-7018966.

* cited by examiner

POWER CONTROL FOR AN AEROSOL DELIVERY DEVICE

CROSS-REFERENCE TO RELATED APPLICATIONS

The present application is a continuation of U.S. patent application Ser. No. 16/669,031, entitled: Power Control for an Aerosol Delivery Device, filed Oct. 30, 2019, which claims priority to U.S. Provisional Patent Application No. 62/769,296, entitled: Management System for Control Functions in a Vaporization System, filed on Nov. 19, 2018, and U.S. Provisional Patent Application No. 62/911,727, entitled: Power Control for an Aerosol Delivery Device, filed on Oct. 7, 2019, the disclosures of which are incorporated herein by reference in their entireties.

TECHNOLOGICAL FIELD

The present disclosure relates to aerosol delivery devices such as smoking articles that produce aerosol. The smoking articles may be configured to heat or otherwise dispense an aerosol precursor or otherwise produce an aerosol from an aerosol precursor, which may incorporate materials that may be made or derived from tobacco or otherwise incorporate tobacco, the precursor being capable of forming an inhalable substance for human consumption.

BACKGROUND

Many smoking articles have been proposed through the years as improvements upon, or alternatives to, smoking products based upon combusting tobacco. Some example alternatives have included devices wherein a solid or liquid fuel is combusted to transfer heat to tobacco or wherein a chemical reaction is used to provide such heat source. Additional example alternatives use electrical energy to heat tobacco and/or other aerosol generating substrate materials, such as described in U.S. Pat. No. 9,078,473 to Worm et al., which is incorporated herein by reference.

The point of the improvements or alternatives to smoking articles typically has been to provide the sensations associated with cigarette, cigar, or pipe smoking, without delivering considerable quantities of incomplete combustion and pyrolysis products. To this end, there have been proposed numerous smoking products, flavor generators, and medicinal inhalers which utilize electrical energy to vaporize or heat a volatile material, or attempt to provide the sensations of cigarette, cigar, or pipe smoking without burning tobacco to a significant degree. See, for example, the various alternative smoking articles, aerosol delivery devices and heat generating sources set forth in the background art described in U.S. Pat. No. 7,726,320 to Robinson et al.; and U.S. Pat. App. Pub. Nos. 2013/0255702 to Griffith, Jr. et al.; and 2014/0096781 to Sears et al., which are incorporated herein by reference. See also, for example, the various types of smoking articles, aerosol delivery devices and electrically powered heat generating sources referenced by brand name and commercial source in U.S. Pat. App. Pub. No. 2015/0220232 to Bless et al., which is incorporated herein by reference. Additional types of smoking articles, aerosol delivery devices and electrically powered heat generating sources referenced by brand name and commercial source are listed in U.S. Pat. App. Pub. No. 2015/0245659 to DePiano et al., which is also incorporated herein by reference. Other representative cigarettes or smoking articles that have been described and, in some instances, been made commercially available include those described in U.S. Pat. No. 4,735,217 to Gerth et al.; U.S. Pat. Nos. 4,922,901, 4,947,874, and 4,947,875 to Brooks et al.; U.S. Pat. No. 5,060,671 to Counts et al.; U.S. Pat. No. 5,249,586 to Morgan et al.; U.S. Pat. No. 5,388,594 to Counts et al.; U.S. Pat. No. 5,666,977 to Higgins et al.; U.S. Pat. No. 6,053,176 to Adams et al.; U.S. Pat. No. 6,164,287 to White; U.S. Pat. No. 6,196,218 to Voges; U.S. Pat. No. 6,810,883 to Felter et al.; U.S. Pat. No. 6,854,461 to Nichols; U.S. Pat. No. 7,832,410 to Hon; U.S. Pat. No. 7,513,253 to Kobayashi; U.S. Pat. No. 7,726,320 to Robinson et al.; U.S. Pat. No. 7,896,006 to Hamano; U.S. Pat. No. 6,772,756 to Shayan; U.S. Pat. Pub. No. 2009/0095311 to Hon; U.S. Pat. Pub. Nos. 2006/0196518, 2009/0126745, and 2009/0188490 to Hon; U.S. Pat. Pub. No. 2009/0272379 to Thorens et al.; U.S. Pat. Pub. Nos. 2009/0260641 and 2009/0260642 to Monsees et al.; U.S. Pat. Pub. Nos. 2008/0149118 and 2010/0024834 to Oglesby et al.; U.S. Pat. Pub. No. 2010/0307518 to Wang; and WO 2010/091593 to Hon, which are incorporated herein by reference.

Representative products that resemble many of the attributes of traditional types of cigarettes, cigars or pipes have been marketed as ACCORD® by Philip Morris Incorporated; ALPHA™, JOVE 510™ and M4™ by InnoVapor LLC; CIRRUS™ and FLING™ by White Cloud Cigarettes; BLU™ by Fontem Ventures B.V.; COHITA™, COLIBRI™, ELITE CLASSIC™, MAGNUM™, PHANTOM™ and SENSE™ by EPUFFER® International Inc.; DUOPRO™, STORM™ and VAPORKING® by Electronic Cigarettes, Inc.; EGAR™ by Egar Australia; eGo-C™ and eGo-T™ by Joyetech; ELUSION™ by Elusion UK Ltd; EONSMOKE® by Eonsmoke LLC; FIN™ by FIN Branding Group, LLC; SMOKE® by Green Smoke Inc. USA; GREENARETTE™ by Greenarette LLC; HALLIGAN™ HENDU™ JET™, MAXXQ™ PINK™ and PITBULL™ by SMOKE STIK®; HEATBAR™ by Philip Morris International, Inc.; HYDRO IMPERIAL™ and LXE™ from Crown7; LOGIC™ and THE CUBAN™ by LOGIC Technology; LUCI® by Luciano Smokes Inc.; METRO® by Nicotek, LLC; NJOY® and ONEJOY™ by Sottera, Inc.; NO. 7™ by SS Choice LLC; PREMIUM ELECTRONIC CIGARETTE™ by PremiumEstore LLC; RAPP E-MYSTICK™ by Ruyan America, Inc.; RED DRAGON™ by Red Dragon Products, LLC; RUYAN® by Ruyan Group (Holdings) Ltd.; SF® by Smoker Friendly International, LLC; GREEN SMART SMOKER® by The Smart Smoking Electronic Cigarette Company Ltd.; SMOKE ASSIST® by Coastline Products LLC; SMOKING EVERYWHERE® by Smoking Everywhere, Inc.; V2CIGS™ by VMR Products LLC; VAPOR NINE™ by VaporNine LLC; VAPOR4LIFE® by Vapor 4 Life, Inc.; VEPPO™ by E-CigaretteDirect, LLC; VUSE® by R. J. Reynolds Vapor Company; MISTIC MENTHOL product by Mistic Ecigs; the VYPE product by CN Creative Ltd; IQOS™ by Philip Morris International; GLO™ by British American Tobacco; MARK TEN products by Nu Mark LLC; and the JUUL product by Juul Labs, Inc. Yet other electrically powered aerosol delivery devices, and in particular those devices that have been characterized as so-called electronic cigarettes, have been marketed under the tradenames COOLER VISIONS™; DIRECT E-CIG™; DRAGONFLY™; EMIST™; EVERSMOKE™; GAMUCCI®; HYBRID FLAME™; KNIGHT STICKS™; ROYAL BLUES™; SMOKETIP®; and SOUTH BEACH SMOKE™.

However, it may be desirable to provide aerosol delivery devices with improved electronics such as may extend usability of the devices.

BRIEF SUMMARY

The present disclosure relates to aerosol delivery devices configured to produce aerosol and which aerosol delivery devices, in some implementations, may be referred to as electronic cigarettes, heat-not-burn cigarettes (or devices), or no-heat-no-burn devices. The present disclosure includes, without limitation, the following example implementations.

Some example implementations provide an aerosol delivery device comprising: at least one housing; and within the at least one housing, a power source configured to provide an output voltage; an aerosol production component powerable to produce an aerosol from an aerosol precursor composition; a sensor configured to produce measurements of atmospheric air pressure in an air flow path through the at least one housing; a switch coupled to and between the power source and the aerosol production component; and processing circuitry coupled to the sensor and the switch, and configured to at least: determine a difference between the measurements of atmospheric air pressure from the sensor, and a reference atmospheric air pressure; and only when the difference is at least a threshold difference, output a signal to cause the switch to switchably connect and disconnect the output voltage to the aerosol production component to power the aerosol production component for an aerosol-production time period, the switch caused to switchably connect and disconnect the output voltage to adjust power provided to the aerosol production component to a power target that is variable according to a predetermined relationship between the difference and the power target.

In some example implementations of the aerosol delivery device of any preceding example implementation, or any combination of any preceding example implementations, outside the aerosol-production time period in which the signal is absent and the output voltage to the aerosol production component is disconnected, the sensor is configured to produce measurements of ambient atmospheric air pressure to which the sensor is exposed, and the processing circuitry is configured to set the reference atmospheric air pressure based on the measurements of ambient atmospheric air pressure.

In some example implementations of the aerosol delivery device of any preceding example implementation, or any combination of any preceding example implementations, the processing circuitry configured to set the reference atmospheric air pressure includes the processing circuitry further configured to determine an average of the measurements of ambient atmospheric air pressure and set the reference atmospheric air pressure to the average.

In some example implementations of the aerosol delivery device of any preceding example implementation, or any combination of any preceding example implementations, the threshold difference is set to reflect a minimum deviation from the reference atmospheric air pressure caused by a puff action of using the aerosol delivery device by a user.

In some example implementations of the aerosol delivery device of any preceding example implementation, or any combination of any preceding example implementations, the processing circuitry configured to determine the difference and output the signal includes the processing circuitry configured to: determine a difference between a most-recent of the measurements and the reference atmospheric air pressure, and if the difference is at least the threshold difference; determine a rate of change of the atmospheric air pressure from at least some of the measurements atmospheric air pressure, and if the difference is caused by the puff action based on the rate of change; and output the signal only when the difference is at least the threshold difference and is caused by the puff action.

In some example implementations of the aerosol delivery device of any preceding example implementation, or any combination of any preceding example implementations, the processing circuitry configured to output the signal includes the processing circuitry configured to output the signal to power the aerosol production component for the aerosol-production time period that is coextensive with the puff action.

In some example implementations of the aerosol delivery device of any preceding example implementation, or any combination of any preceding example implementations, the predetermined relationship is described by a step function, a linear function, a non-linear function, or a combination thereof.

In some example implementations of the aerosol delivery device of any preceding example implementation, or any combination of any preceding example implementations, the predetermined relationship is described by a combination of a step function and a linear function.

In some example implementations of the aerosol delivery device of any preceding example implementation, or any combination of any preceding example implementations, the aerosol precursor composition is a liquid, solid or semi-solid.

In some example implementations of the aerosol delivery device of any preceding example implementation, or any combination of any preceding example implementations, the processing circuitry configured to output the signal includes the processing circuitry configured to output a pulse width modulation (PWM) signal, and a duty cycle of the PWM signal is adjustable to thereby adjust the power provided to the aerosol production component.

In some example implementations of the aerosol delivery device of any preceding example implementation, or any combination of any preceding example implementations, at a periodic rate during the aerosol-production time period, the processing circuitry is further configured to: determine a sample window of measurements of instantaneous actual power provided to the aerosol production component, each measurement of the sample window of measurements determined as a product of a voltage at and a current through the aerosol production component; calculate a moving average power provided to the aerosol production component based on the sample window of measurements of instantaneous actual power; compare the moving average power to the power target; and output the signal to cause the switch to respectively disconnect and connect the output voltage at each instance in which the moving average power is respectively above or below the power target.

Some example implementations provide a control body for an aerosol delivery device, the control body comprising: a power source configured to provide an output voltage; an aerosol production component or terminals configured to connect the aerosol production component to the control body, the aerosol production component powerable to produce an aerosol from an aerosol precursor composition; a sensor configured to produce measurements of atmospheric air pressure in an air flow path through the at least one housing; a switch coupled to and between the power source and the aerosol production component; and processing circuitry coupled to the sensor and the switch, and configured to at least: determine a difference between the measurements of atmospheric air pressure from the sensor, and a reference atmospheric air pressure; and only when the difference is at least a threshold difference, output a signal to cause the switch to switchably connect and disconnect the output voltage to the aerosol production component to power the aerosol production component for an aerosol-production time period, the switch caused to switchably connect and disconnect the output voltage to adjust power provided to the aerosol production component to a power target that is variable according to a predetermined relationship between the difference and the power target.

In some example implementations of the control body of any preceding example implementation, or any combination of any preceding example implementations, outside the aerosol-production time period in which the signal is absent and the output voltage to the aerosol production component is disconnected, the sensor is configured to produce measurements of ambient atmospheric air pressure to which the sensor is exposed, and the processing circuitry is configured to set the reference atmospheric air pressure based on the measurements of ambient atmospheric air pressure.

In some example implementations of the control body of any preceding example implementation, or any combination of any preceding example implementations, the processing circuitry configured to set the reference atmospheric air pressure includes the processing circuitry further configured to determine an average of the measurements of ambient atmospheric air pressure and set the reference atmospheric air pressure to the average.

In some example implementations of the control body of any preceding example implementation, or any combination of any preceding example implementations, the threshold difference is set to reflect a minimum deviation from the reference atmospheric air pressure caused by a puff action of using the aerosol delivery device by a user.

In some example implementations of the control body of any preceding example implementation, or any combination of any preceding example implementations, the processing circuitry configured to determine the difference and output the signal includes the processing circuitry configured to: determine a difference between a most-recent of the measurements and the reference atmospheric air pressure, and if the difference is at least the threshold difference; determine a rate of change of the atmospheric air pressure from at least some of the measurements atmospheric air pressure, and if the difference is caused by the puff action based on the rate of change; and output the signal only when the difference is at least the threshold difference and is caused by the puff action.

In some example implementations of the control body of any preceding example implementation, or any combination of any preceding example implementations, the processing circuitry configured to output the signal includes the processing circuitry configured to output the signal to power the aerosol production component for the aerosol-production time period that is coextensive with the puff action.

In some example implementations of the control body of any preceding example implementation, or any combination of any preceding example implementations, the predetermined relationship is described by a step function, a linear function, a non-linear function, or a combination thereof.

In some example implementations of the control body of any preceding example implementation, or any combination of any preceding example implementations, the predetermined relationship is described by a combination of a step function and a linear function.

In some example implementations of the control body of any preceding example implementation, or any combination of any preceding example implementations, the aerosol precursor composition is a liquid, solid or semi-solid.

In some example implementations of the control body of any preceding example implementation, or any combination of any preceding example implementations, the processing circuitry configured to output the signal includes the processing circuitry configured to output a pulse width modulation (PWM) signal, and a duty cycle of the PWM signal is adjustable to thereby adjust the power provided to the aerosol production component.

In some example implementations of the control body of any preceding example implementation, or any combination of any preceding example implementations, at a periodic rate during the heating time period, the processing circuitry is further configured to: determine a sample window of measurements of instantaneous actual power provided to the aerosol production component, each measurement of the sample window of measurements determined as a product of a voltage at and a current through the aerosol production component; calculate a moving average power provided to the aerosol production component based on the sample window of measurements of instantaneous actual power; compare the moving average power to the power target; and output the signal to cause the switch to respectively disconnect and connect the output voltage at each instance in which the moving average power is respectively above or below the power target.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable, unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE FIGURES

Figure 1:
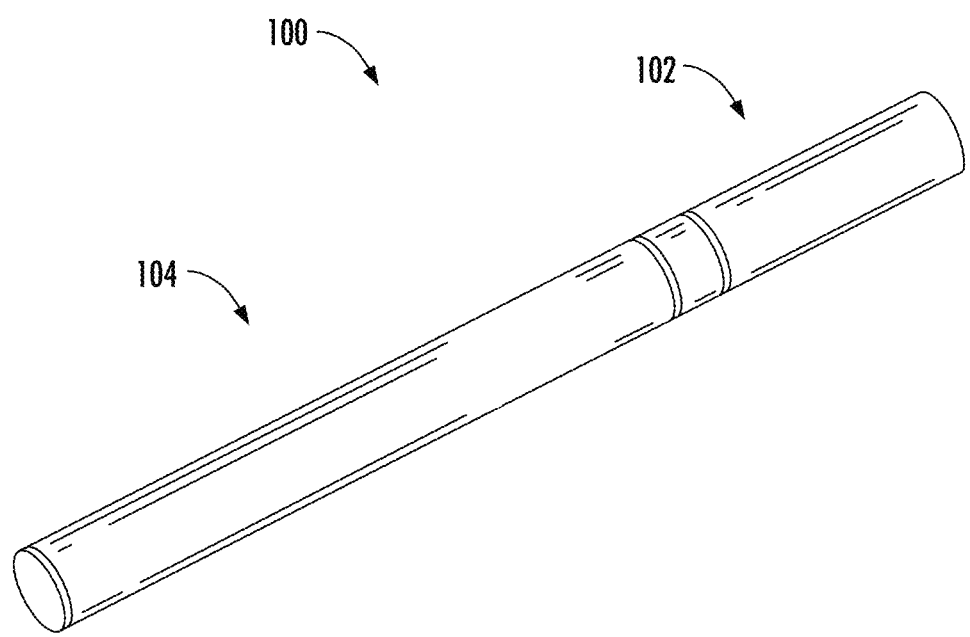
Figure 2:
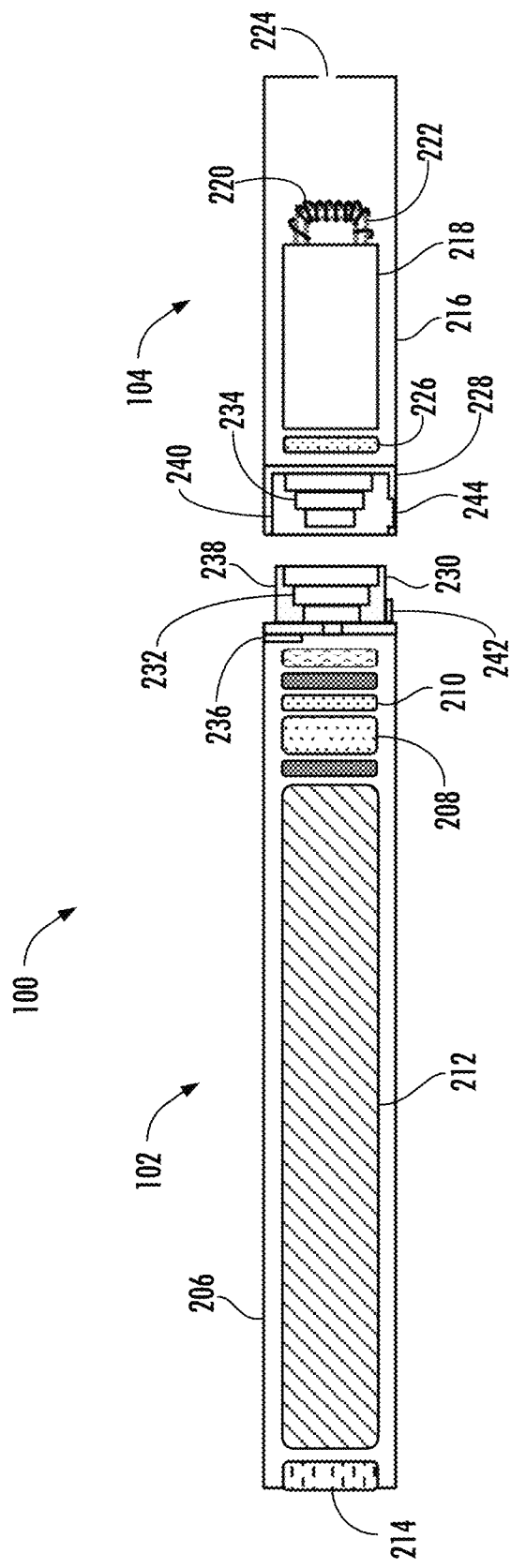
Figure 3:
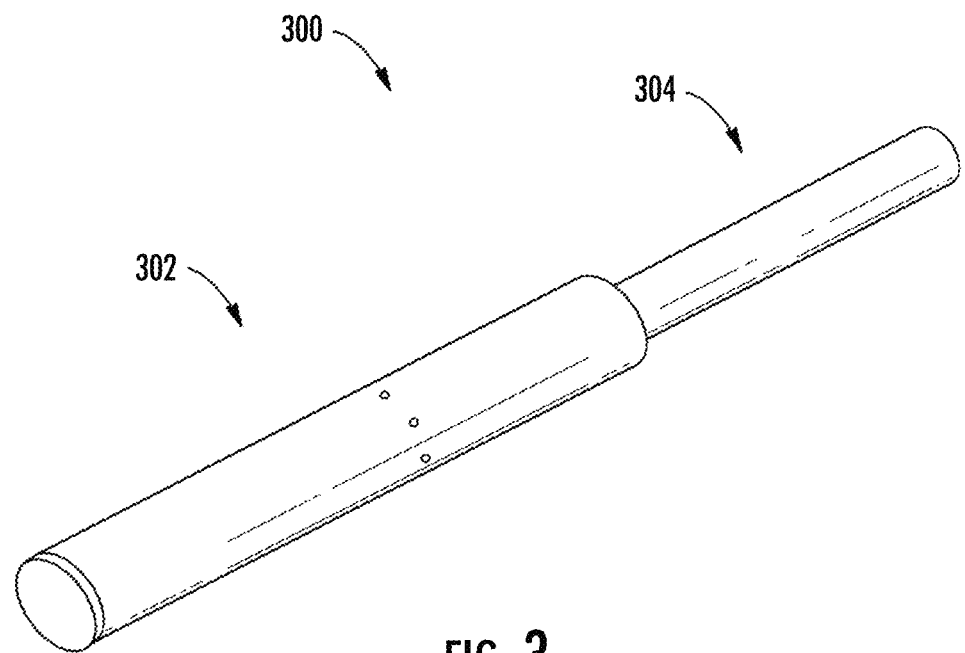
Figure 4:
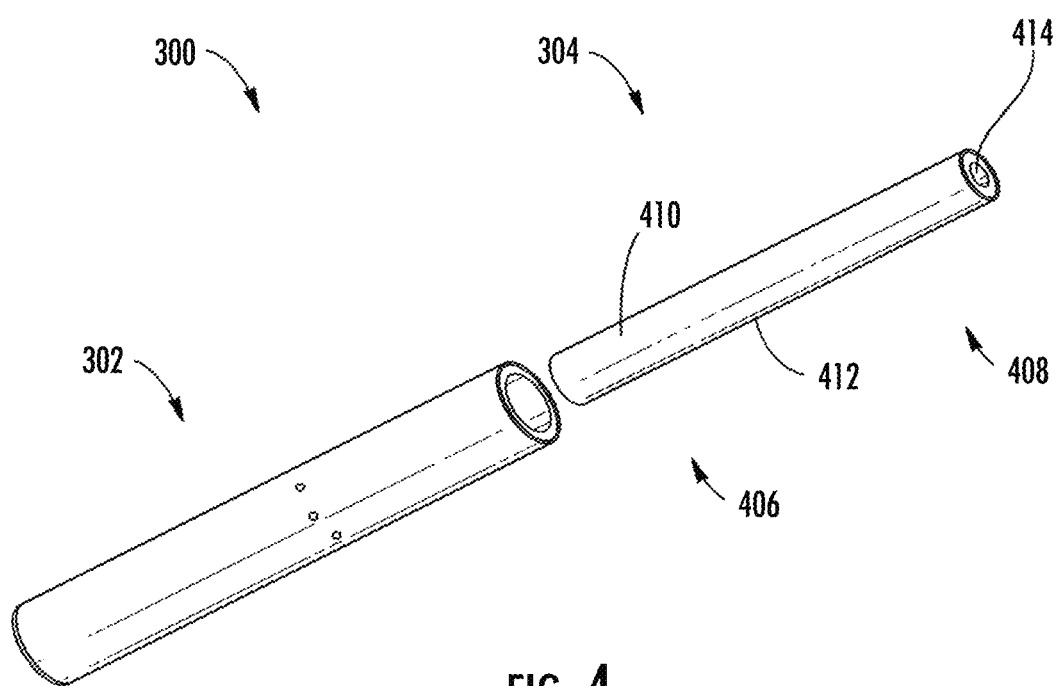
Figure 5:
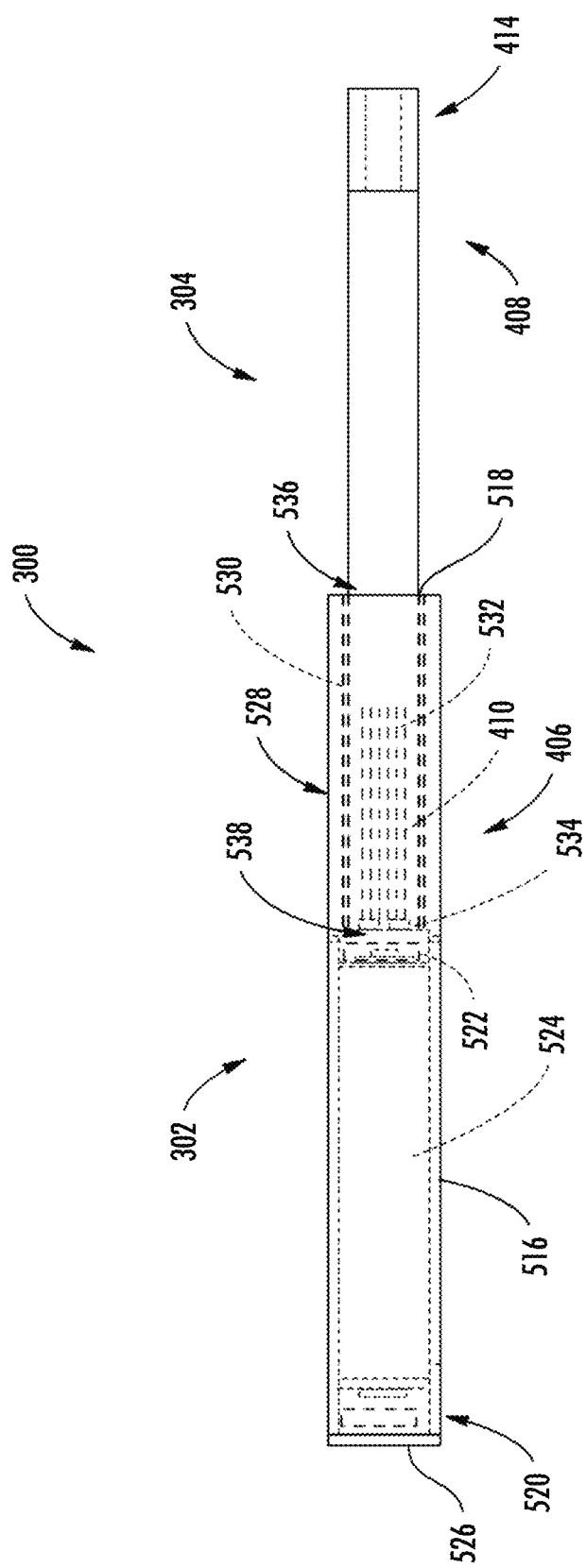
Figure 6:
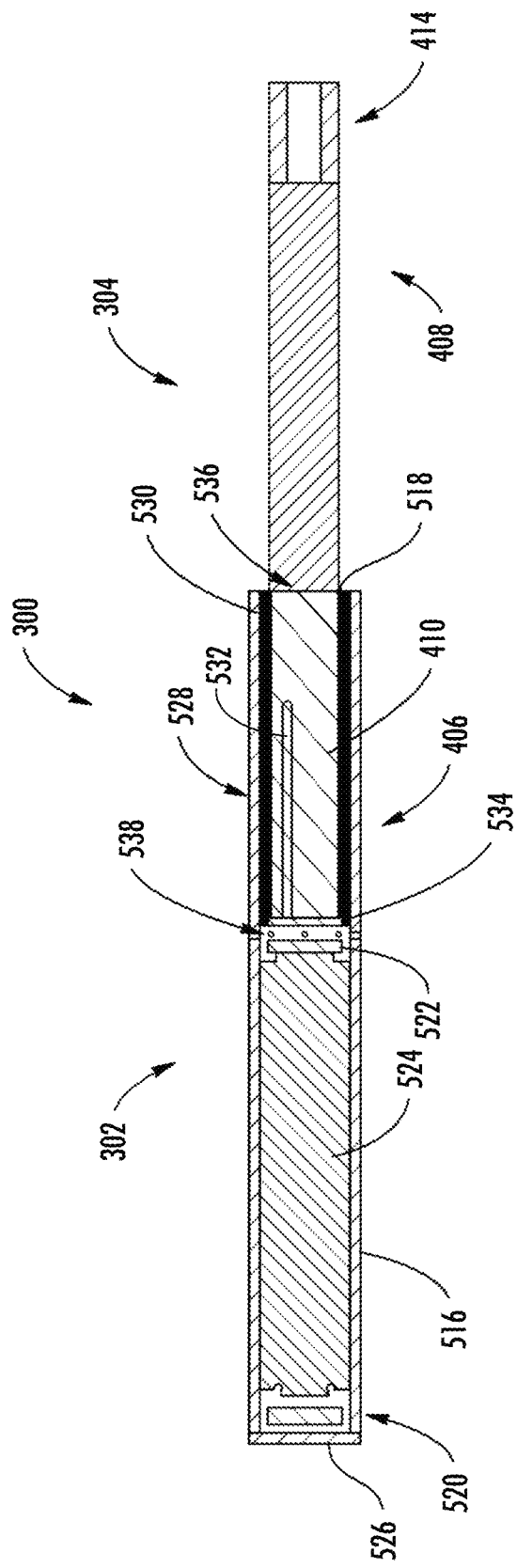
Figure 7:
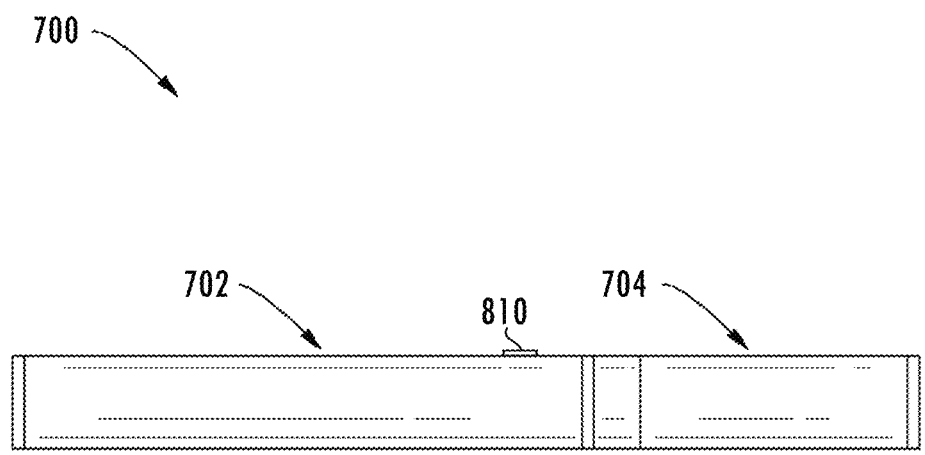
Figure 8:
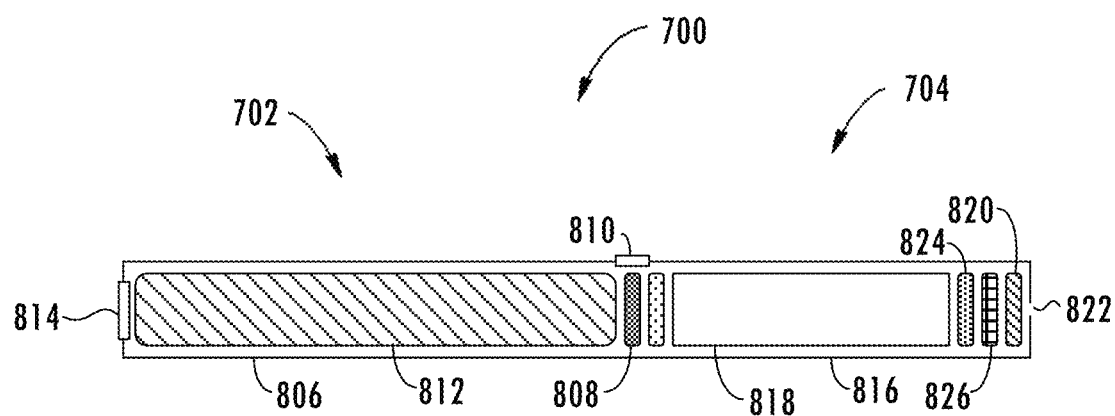
Figure 9:
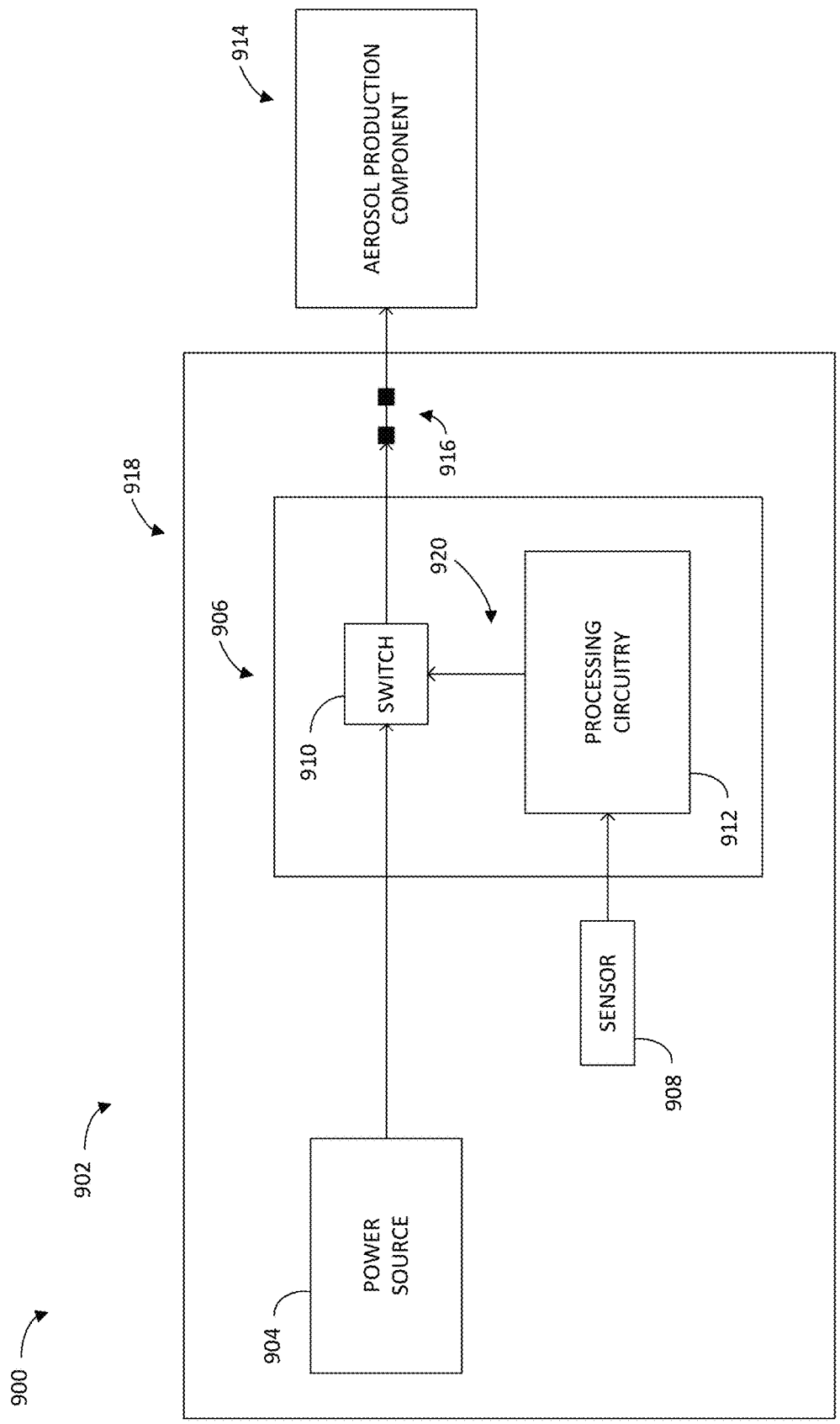
Figure 10:
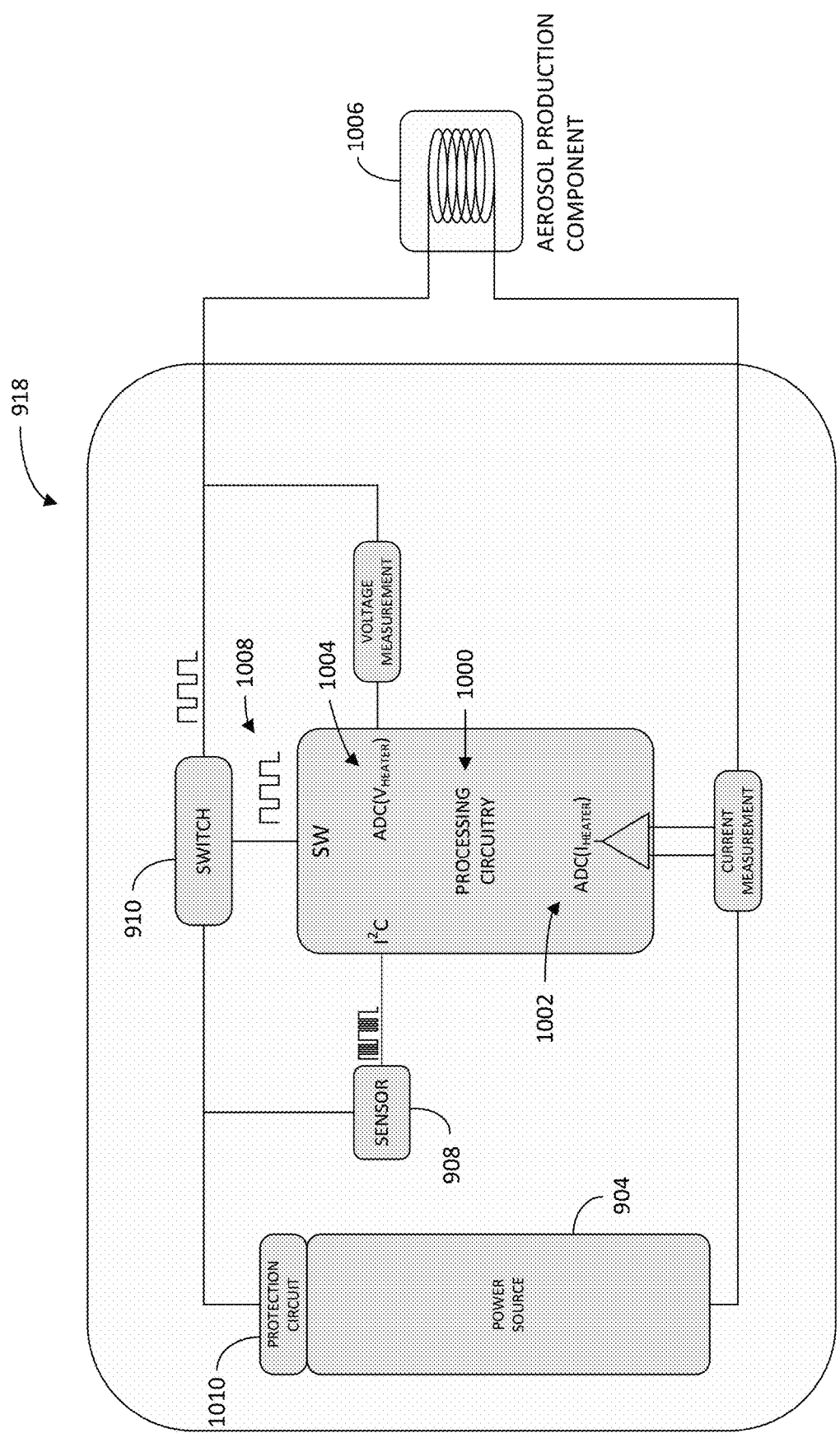
Figure 11:
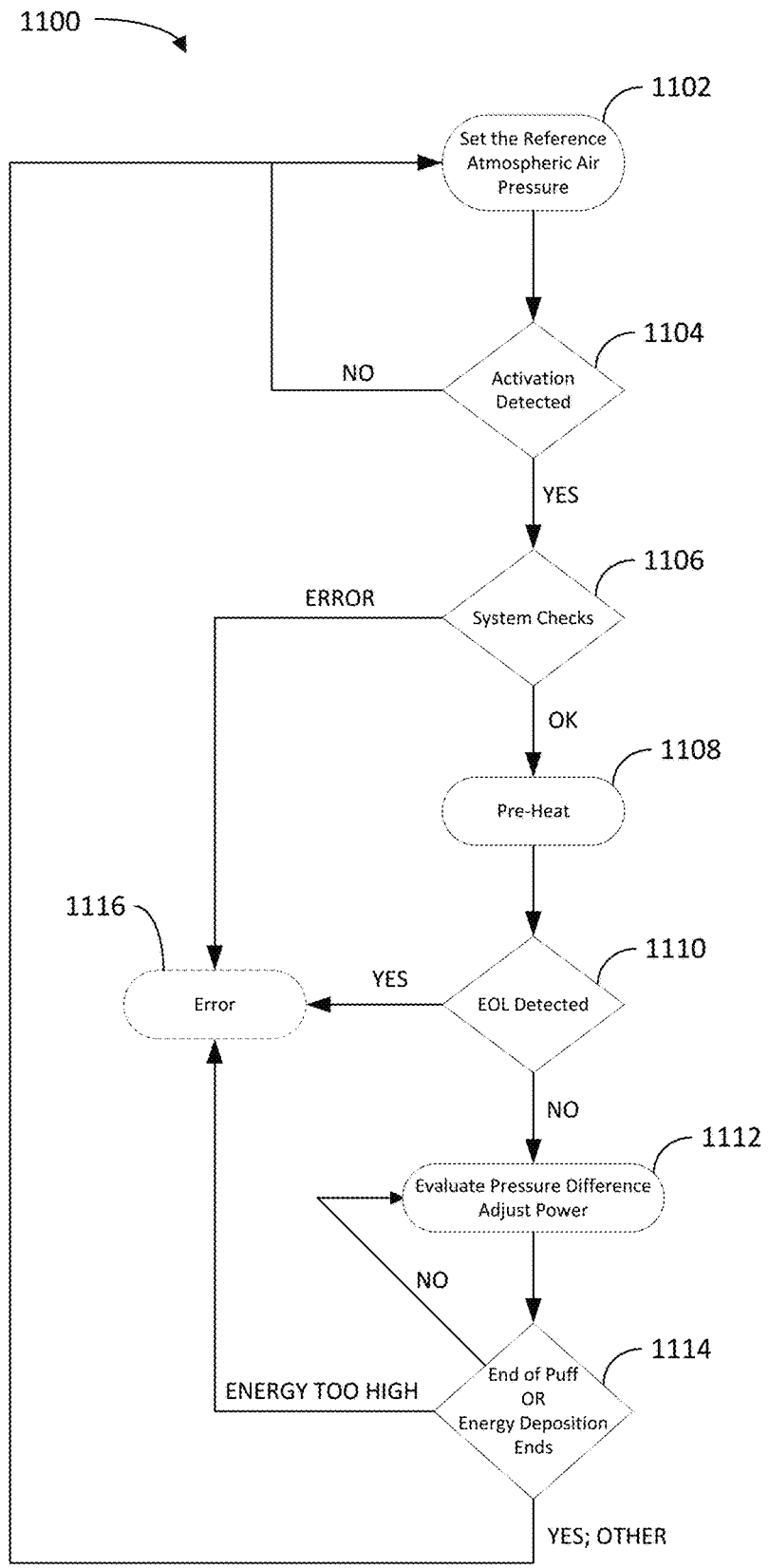
Figure 12A:
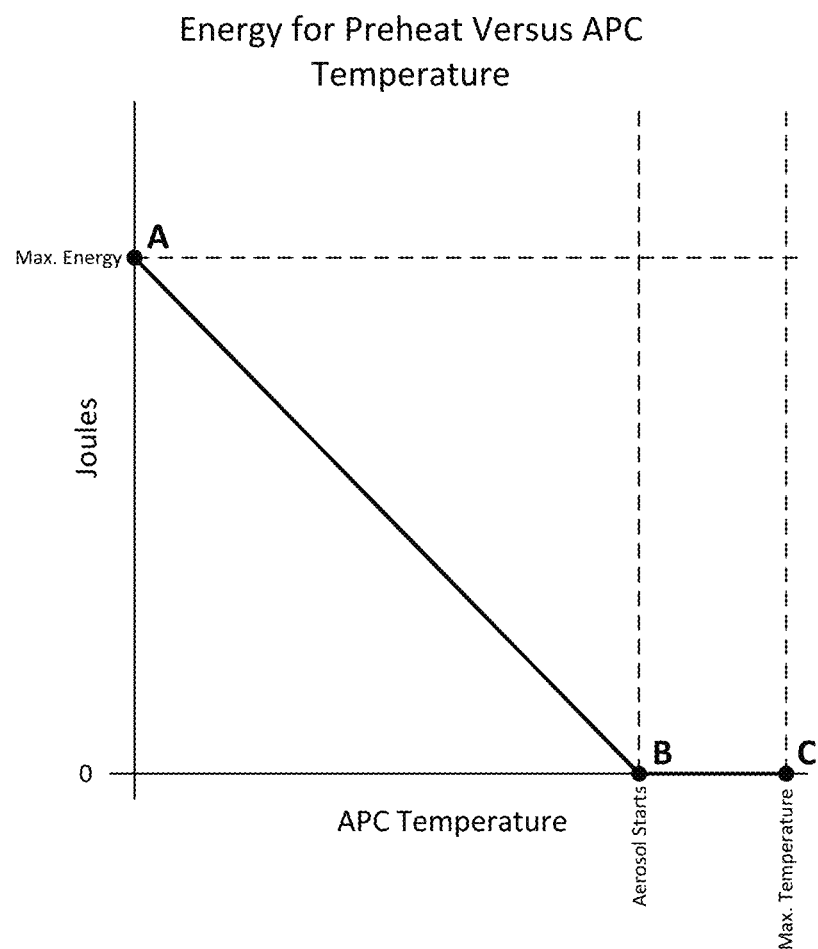
Figure 12B:
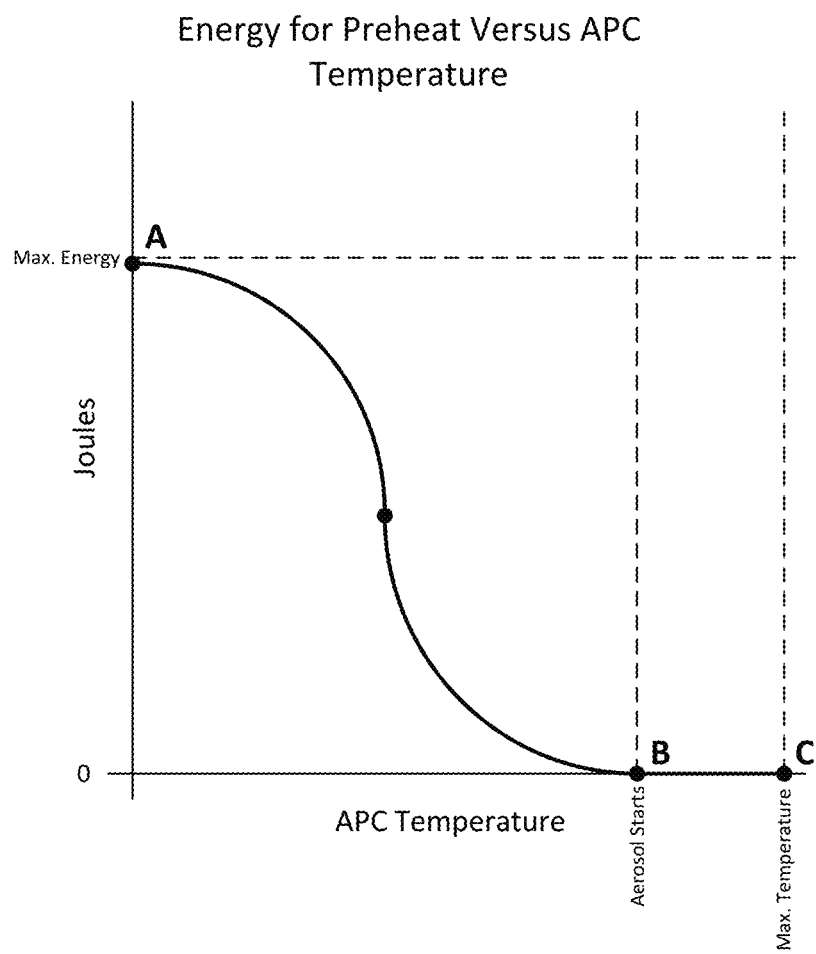
Figure 13:
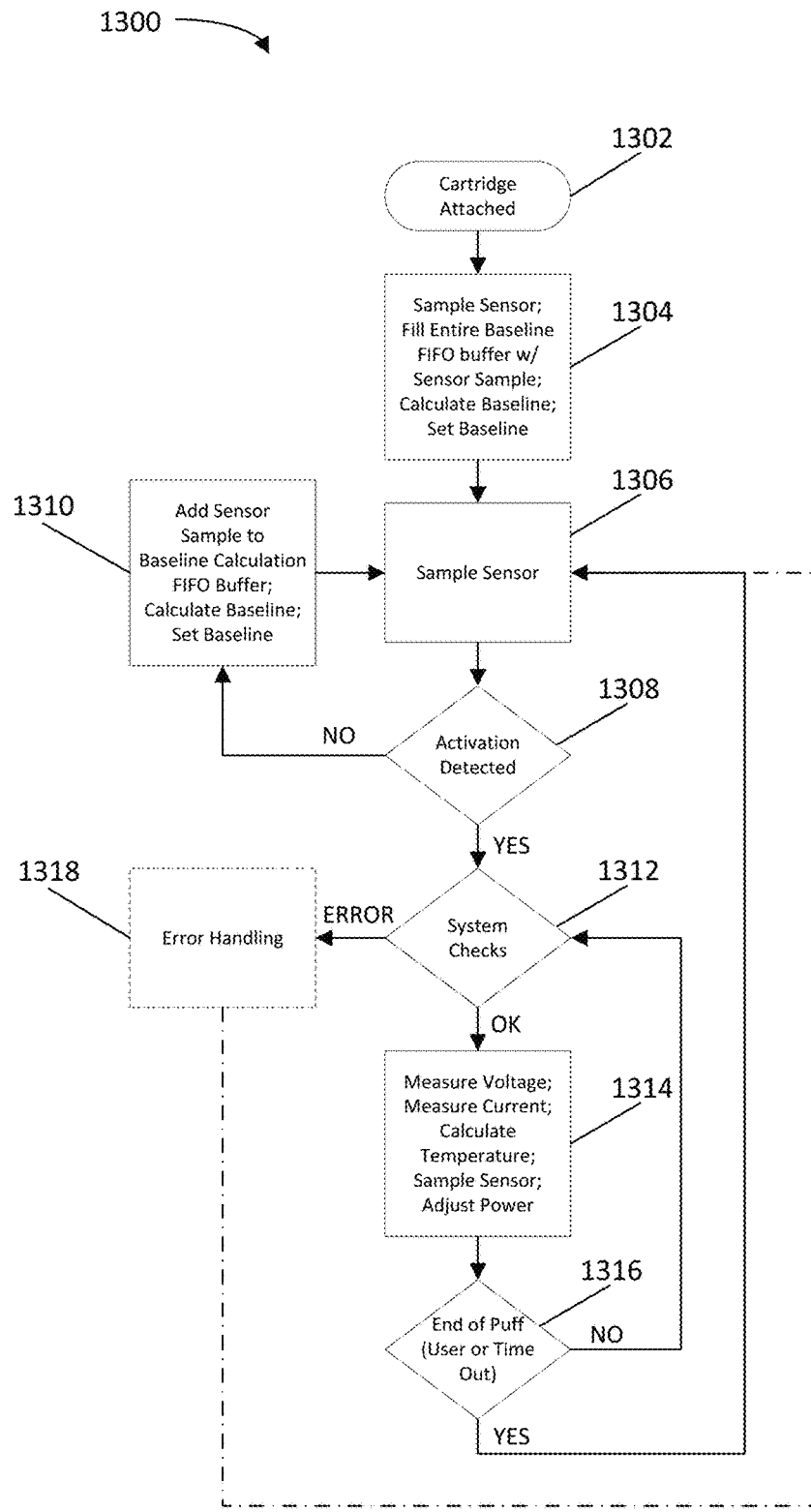

Having thus described aspects of the disclosure in the foregoing general terms, reference will now be made to the accompanying figures, which are not necessarily drawn to scale, and wherein:

FIG. 1 illustrates a perspective view of an aerosol delivery device including a cartridge and a control body that are coupled to one another, according to an example implementation of the present disclosure;

FIG. 2 is a partially cut-away view of the aerosol delivery device of FIG. 1 in which the cartridge and control body are decoupled from one another, according to an example implementation;

FIGS. 3 and 4 illustrate a perspective view of an aerosol delivery device comprising a control body and an aerosol source member that are respectively coupled to one another and decoupled from one another, according to another example implementation of the present disclosure;

FIGS. 5 and 6 illustrate respectively a front view of and a sectional view through the aerosol delivery device of FIGS. 3 and 4, according to an example implementation;

FIGS. 7 and 8 illustrate respectively a side view and a partially cut-away view of an aerosol delivery device including a cartridge coupled to a control body, according to example implementations;

FIG. 9 illustrates a circuit diagram of an aerosol delivery device according to example implementations of the present disclosure;

FIG. 10 illustrates a circuit diagram of components of an aerosol delivery device FIG. 11 illustrates a flowchart of a method of power control for an aerosol delivery device according to example implementations of the present disclosure;

FIG. 11 illustrates a flowchart of a method of power control for an aerosol delivery device according to example implementations of the present disclosure;

FIGS. 12A and 12B illustrate functional relationships for pre-heating of an aerosol delivery device according to example implementations of the present disclosure;

FIG. 13 illustrates a flowchart of another method of power control for an aerosol delivery device according to example implementations of the present disclosure; and FIGS. 14A, 14B, 14C, 14D, 14E, and 14F illustrate functional relationships of power control for an aerosol delivery device according to example implementations of the present disclosure, according to example implementations of the present disclosure.

DETAILED DESCRIPTION

The present disclosure will now be described more fully hereinafter with reference to example implementations thereof. These example implementations are described so that this disclosure will be thorough and complete, and will fully convey the scope of the disclosure to those skilled in the art. Indeed, the disclosure may be embodied in many different forms and should not be construed as limited to the implementations set forth herein; rather, these implementations are provided so that this disclosure will satisfy applicable legal requirements. As used in the specification and the appended claims, the singular forms "a," "an," "the" and the like include plural referents unless the context clearly dictates otherwise. Also, while reference may be made herein to quantitative measures, values, geometric relationships or the like, unless otherwise stated, any one or more if not all of these may be absolute or approximate to account for acceptable variations that may occur, such as those due to engineering tolerances or the like.

As described hereinafter, the present disclosure relates to aerosol delivery devices. Aerosol delivery devices may be configured to produce an aerosol (an inhalable substance) from an aerosol precursor composition (sometimes referred to as an inhalable substance medium). The aerosol precursor composition may comprise one or more of a solid tobacco material, a semi-solid tobacco material, or a liquid aerosol precursor composition. In some implementations, the aerosol delivery devices may be configured to heat and produce an aerosol from a fluid aerosol precursor composition (e.g., a liquid aerosol precursor composition). Such aerosol delivery devices may include so-called electronic cigarettes. In other implementations, the aerosol delivery devices may comprise heat-not-burn devices. In yet other implementations, the aerosol delivery devices may comprise no-heat-no-burn devices.

Liquid aerosol precursor composition, also referred to as a vapor precursor composition or "e-liquid," is particularly useful for electronic cigarettes and no-heat-no-burn devices. Liquid aerosol precursor composition may comprise a variety of components including, by way of example, a polyhydric alcohol (e.g., glycerin, propylene glycol, or a mixture thereof), nicotine, tobacco, tobacco extract, and/or flavorants. In some examples, the aerosol precursor composition comprises glycerin and nicotine.

Some liquid aerosol precursor compositions that may be used in conjunction with various implementations may include one or more acids such as levulinic acid, succinic acid, lactic acid, pyruvic acid, benzoic acid, fumaric acid, combinations thereof, and the like. Inclusion of an acid(s) in liquid aerosol precursor compositions including nicotine may provide a protonated liquid aerosol precursor composition, including nicotine in salt form. Representative types of liquid aerosol precursor components and formulations are set forth and characterized in U.S. Pat. No. 7,726,320 to Robinson et al.; U.S. Pat. No. 9,254,002 to Chong et al.; and U.S. Pat. App. Pub. Nos. 2013/0008457 to Zheng et al., 2015/0020823 to Lipowicz et al., and 2015/0020830 to Koller; as well as PCT Pat. App. Pub. No. WO 2014/182736 to Bowen et al.; and U.S. Pat. No. 8,881,737 to Collett et al., the disclosures of which are incorporated herein by reference. Other aerosol precursors that may be employed include the aerosol precursors that have been incorporated in any of a number of the representative products identified above. Also desirable are the so-called "smoke juices" for electronic cigarettes that have been available from Johnson Creek Enterprises LLC. Still further example aerosol precursor compositions are sold under the brand names BLACK NOTE, COSMIC FOG, THE MILKMAN E-LIQUID, FIVE PAWNS, THE VAPOR CHEF, VAPE WILD, BOOSTED, THE STEAM FACTORY, MECH SAUCE, CASEY JONES MAINLINE RESERVE, MITTEN VAPORS, DR. CRIMMY'S V-LIQUID, SMILEY E LIQUID, BEANTOWN VAPOR, CUTTWOOD, CYCLOPS VAPOR, SICBOY, GOOD LIFE VAPOR, TELEOS, PINUP VAPORS, SPACE JAM, MT. BAKER VAPOR, and JIMMY THE JUICE MAN. Implementations of effervescent materials can be used with the aerosol precursor, and are described, by way of example, in U.S. Pat. App. Pub. No. 2012/0055494 to Hunt et al., which is incorporated herein by reference. Further, the use of effervescent materials is described, for example, in U.S. Pat. No. 4,639,368 to Niazi et al.; U.S. Pat. No. 5,178,878 to Wehling et al.; U.S. Pat. No. 5,223,264 to Wehling et al.; U.S. Pat. No. 6,974,590 to Pather et al.; U.S. Pat. No. 7,381,667 to Bergquist et al.; U.S. Pat. No. 8,424,541 to Crawford et al.; U.S. Pat. No. 8,627,828 to Strickland et al.; and U.S. Pat. No. 9,307,787 to Sun et al.; as well as U.S. Pat. App. Pub. Nos. 2010/0018539 to Brinkley et al., and PCT Pat. App. Pub. No. WO 97/06786 to Johnson et al., all of which are incorporated by reference herein.

The aerosol precursor composition may additionally or alternatively include other active ingredients including, but not limited to, botanical ingredients (e.g., lavender, peppermint, chamomile, basil, rosemary, thyme, *eucalyptus*, ginger, *cannabis, ginseng*, maca, and tisanes), stimulants (e.g., caffeine and guarana), amino acids (e.g., taurine, theanine, phenylalanine, tyrosine, and tryptophan) and/or pharmaceutical, nutraceutical, and medicinal ingredients (e.g., vitamins, such as B6, B12, and C and cannabinoids, such as tetrahydrocannabinol (THC) and cannabidiol (CBD). The particular percentages and choice of ingredients will vary depending upon the desired flavor, texture, and other characteristics. Example active ingredients would include any ingredient known to impact one or more biological functions within the body, such as ingredients that furnish pharmacological activity or other direct effect in the diagnosis, cure, mitigation, treatment, or prevention of disease, or which affect the structure or any function of the body of humans or other animals (e.g., provide a stimulating action on the central nervous system, have an energizing effect, an antipyretic or analgesic action, or an otherwise useful effect on the body).

Representative types of substrates, reservoirs or other components for supporting the aerosol precursor are described in U.S. Pat. No. 8,528,569 to Newton; U.S. Pat. App. Pub. No. 2014/0261487 to Chapman et al.; U.S. Pat. App. Pub. No. 2015/0059780 to Davis et al.; and U.S. Pat. App. Pub. No. 2015/0216232 to Bless et al., all of which are incorporated herein by reference. Additionally, various wicking materials, and the configuration and operation of those wicking materials within certain types of electronic cigarettes, are set forth in U.S. Pat. No. 8,910,640 to Sears et al., which is incorporated herein by reference.

In other implementations, the aerosol delivery devices may comprise heat-not-burn devices, configured to heat a solid aerosol precursor composition (e.g., an extruded tobacco rod) or a semi-solid aerosol precursor composition (e.g., a glycerin-loaded tobacco paste). The aerosol precursor composition may comprise tobacco-containing beads, tobacco shreds, tobacco strips, reconstituted tobacco material, or combinations thereof, and/or a mix of finely ground tobacco, tobacco extract, spray dried tobacco extract, or other tobacco form mixed with optional inorganic materials (such as calcium carbonate), optional flavors, and aerosol forming materials to form a substantially solid or moldable (e.g., extrudable) substrate. Representative types of solid and semi-solid aerosol precursor compositions and formulations are disclosed in U.S. Pat. No. 8,424,538 to Thomas et al.; U.S. Pat. No. 8,464,726 to Sebastian et al.; U.S. Pat. App. Pub. No. 2015/0083150 to Conner et al.; U.S. Pat. App. Pub. No. 2015/0157052 to Ademe et al.; and U.S. Pat. App. Pub. No. 2017/0000188 to Nordskog et al., all of which are incorporated by reference herein. Further representative types of solid and semi-solid aerosol precursor compositions and arrangements include those found in the NEOSTIKS™ consumable aerosol source members for the GLO™ product by British American Tobacco and in the HEETS™ consumable aerosol source members for the IQOS™ product by Philip Morris International, Inc.

In various implementations, the inhalable substance specifically may be a tobacco component or a tobacco-derived material (i.e., a material that is found naturally in tobacco that may be isolated directly from the tobacco or synthetically prepared). For example, the aerosol precursor composition may comprise tobacco extracts or fractions thereof combined with an inert substrate. The aerosol precursor composition may further comprise unburned tobacco or a composition containing unburned tobacco that, when heated to a temperature below its combustion temperature, releases an inhalable substance. In some implementations, the aerosol precursor composition may comprise tobacco condensates or fractions thereof (i.e., condensed components of the smoke produced by the combustion of tobacco, leaving flavors and, possibly, nicotine).

Tobacco materials useful in the present disclosure can vary and may include, for example, flue-cured tobacco, burley tobacco, Oriental tobacco or Maryland tobacco, dark tobacco, dark-fired tobacco and *Rustica* tobaccos, as well as other rare or specialty tobaccos, or blends thereof. Tobacco materials also can include so-called "blended" forms and processed forms, such as processed tobacco stems (e.g., cut-rolled or cut-puffed stems), volume expanded tobacco (e.g., puffed tobacco, such as dry ice expanded tobacco (DIET), preferably in cut filler form), reconstituted tobaccos (e.g., reconstituted tobaccos manufactured using paper-making type or cast sheet type processes). Various representative tobacco types, processed types of tobaccos, and types of tobacco blends are set forth in U.S. Pat. No. 4,836,224 to Lawson et al., U.S. Pat. No. 4,924,888 to Perfetti et al., U.S. Pat. No. 5,056,537 to Brown et al., U.S. Pat. No. 5,159,942 to Brinkley et al., U.S. Pat. No. 5,220,930 to Gentry, U.S. Pat. No. 5,360,023 to Blakley et al., U.S. Pat. No. 6,701,936 to Shafer et al., U.S. Pat. No. 7,011,096 to Li et al., U.S. Pat. No. 7,017,585 to Li et al., and U.S. Pat. No. 7,025,066 to Lawson et al.; U.S. Pat. App. Pub. No. 2004/0255965 to Perfetti et al.; PCT Pat. App. Pub. No. WO 02/37990 to Bereman; and Bombick et al., Fund. Appl. Toxicol., 39, p. 11-17 (1997), which are incorporated herein by reference. Further example tobacco compositions that may be useful in a smoking device, including according to the present disclosure, are disclosed in U.S. Pat. No. 7,726,320 to Robinson et al., which is incorporated herein by reference.

Still further, the aerosol precursor composition may comprise an inert substrate having the inhalable substance, or a precursor thereof, integrated therein or otherwise deposited thereon. For example, a liquid comprising the inhalable substance may be coated on or absorbed or adsorbed into the inert substrate such that, upon application of heat, the inhalable substance is released in a form that can be withdrawn from the inventive article through application of positive or negative pressure. In some aspects, the aerosol precursor composition may comprise a blend of flavorful and aromatic tobaccos in cut filler form. In another aspect, the aerosol precursor composition may comprise a reconstituted tobacco material, such as described in U.S. Pat. No. 4,807,809 to Pryor et al.; U.S. Pat. No. 4,889,143 to Pryor et al.; and U.S. Pat. No. 5,025,814 to Raker, the disclosures of which are incorporated herein by reference. For further information regarding suitable aerosol precursor composition, see U.S. patent application Ser. No. 15/916,834 to Sur et al., filed Mar. 9, 2018, which is incorporated herein by reference.

Regardless of the type of aerosol precursor composition, aerosol delivery devices may include an aerosol production component configured to produce an aerosol from the aerosol precursor composition. In the case of an electronic cigarette or a heat-not-burn device, for example, the aerosol production component may be or include a heating element. In the case of a no-heat-no-burn device, in some examples, the aerosol production component may be or include a vibratable piezoelectric or piezomagnetic mesh.

One example of a suitable heating element is an induction heater. Such heaters often comprise an induction transmitter and an induction receiver. The induction transmitter may include a coil configured to create an oscillating magnetic field (e.g., a magnetic field that varies periodically with time) when alternating current is directed through it. The induction receiver may be at least partially located or received within the induction transmitter and may include a conductive material (e.g., ferromagnetic material or an aluminum coated material). By directing alternating current through the induction transmitter, eddy currents may be generated in the induction receiver via induction. The eddy currents flowing through the resistance of the material defining the induction receiver may heat it by Joule heating (i.e., through the Joule effect). The induction receiver, which may define an atomizer, may be wirelessly heated to form an aerosol from an aerosol precursor composition positioned in proximity to the induction receiver. Various implementations of an aerosol delivery device with an induction heater are described in U.S. Pat. App. Pub. No. 2017/0127722 to Davis et al.; U.S. Pat. App. Pub. No. 2017/0202266 to Sur et al.; U.S. patent application Ser. No. 15/352,153 to Sur et al., filed Nov. 15, 2016; U.S. patent application Ser. No. 15/799,365 to Sebastian et al., filed Oct. 31, 2017; and U.S. patent application Ser. No. 15/836,086 to Sur, all of which are incorporated by reference herein.

In other implementations including those described more particularly herein, the heating element is a conductive heater such as in the case of electrical resistance heater. These heaters may be configured to produce heat when an electrical current is directed through it. In various implementations, a conductive heater may be provided in a variety forms, such as in the form of a foil, a foam, discs, spirals, fibers, wires, films, yarns, strips, ribbons or cylinders. Such heaters often include a metal material and are configured to produce heat as a result of the electrical resistance associated with passing an electrical current through it. Such resistive heaters may be positioned in proximity to and heat an aerosol precursor composition to produce an aerosol. A variety of conductive substrates that may be usable with the present disclosure are described in the above-cited U.S. Pat. App. Pub. No. 2013/0255702 to Griffith et al.

It will be appreciated that example implementations described herein can be applied mutatis mutandis to devices utilizing aerosol production components (e.g., atomizers) other than heating elements, such as in the case of a no-heat-no-burn device. For example, in implementations including a vibratable piezoelectric or piezomagnetic mesh, power to drive the mesh may be controlled by processing circuitry configured to selectively drive the mesh to vibrate and cause a discharge of components of the aerosol precursor composition through the mesh. That is, the processing circuitry may be configured to control power from the power source to selectively drive the vibratable piezoelectric/piezomagnetic mesh.

In some implementations aerosol delivery devices may include a control body and a cartridge in the case of so-called electronic cigarettes or no-heat-no-burn devices, or a control body and an aerosol source member in the case of heat-not-burn devices. In the case of either electronic cigarettes or heat-not-burn devices, the control body may be reusable, whereas the cartridge/aerosol source member may be configured for a limited number of uses and/or configured to be disposable. Various mechanisms may connect the cartridge/aerosol source member to the control body to result in a threaded engagement, a press-fit engagement, an interference fit, a sliding fit, a magnetic engagement, or the like.

The control body and cartridge/aerosol source member may include separate, respective housings or outer bodies, which may be formed of any of a number of different materials. The housing may be formed of any suitable, structurally-sound material. In some examples, the housing may be formed of a metal or alloy, such as stainless steel, aluminum or the like. Other suitable materials include various plastics (e.g., polycarbonate), metal-plating over plastic, ceramics and the like.

The cartridge/aerosol source member may include the aerosol precursor composition. In order to produce aerosol from the aerosol precursor composition, the aerosol production component (e.g., heating element, piezoelectric/piezomagnetic mesh) may be positioned in contact with or proximate the aerosol precursor composition, such as across the control body and cartridge, or in the control body in which the aerosol source member may be positioned. The control body may include a power source, which may be rechargeable or replaceable, and thereby the control body may be reused with multiple cartridges/aerosol source members.

The control body may also include means to activate the aerosol delivery device such as a pushbutton, touch-sensitive surface or the like for manual control of the device. Additionally or alternatively, the control body may include a flow sensor to detect when a user draws on the cartridge/aerosol source member to thereby activate the aerosol delivery device.

In various implementations, the aerosol delivery device according to the present disclosure may have a variety of overall shapes, including, but not limited to an overall shape that may be defined as being substantially rod-like or substantially tubular shaped or substantially cylindrically shaped. In the implementations shown in and described with reference to the accompanying figures, the aerosol delivery device has a substantially round cross-section; however, other cross-sectional shapes (e.g., oval, square, rectangle, triangle, etc.) also are encompassed by the present disclosure. Such language that is descriptive of the physical shape of the article may also be applied to the individual components thereof, including the control body and the cartridge/aerosol source member. In other implementations, the control body may take another handheld shape, such as a small box shape.

In more specific implementations, one or both of the control body and the cartridge/aerosol source member may be referred to as being disposable or as being reusable. For example, the control body may have a power source such as a replaceable battery or a rechargeable battery, SSB, thin-film SSB, rechargeable supercapacitor, lithium-ion or hybrid lithium-ion supercapacitor, or the like. One example of a power source is a TKI-1550 rechargeable lithium-ion battery produced by Tadiran Batteries GmbH of Germany. In another implementation, a useful power source may be a N50-AAA CADNICA nickel-cadmium cell produced by Sanyo Electric Company, Ltd., of Japan. In other implementations, a plurality of such batteries, for example providing 1.2-volts each, may be connected in series. In some implementations, the power source is configured to provide an output voltage. The power source can power the aerosol production component that is powerable to produce an aerosol from an aerosol precursor composition.

In some examples, then, the power source may be connected to and thereby combined with any type of recharging technology. Examples of suitable chargers include chargers that simply supply constant or pulsed direct current (DC) power to the power source, fast chargers that add control circuitry, three-stage chargers, induction-powered chargers, smart chargers, motion-powered chargers, pulsed chargers, solar chargers, USB-based chargers and the like. In some examples, the charger includes a power adapter and any suitable charge circuitry. In other examples, the charger includes the power adapter and the control body is equipped with charge circuitry. In these other examples, the charger may at times be simply referred to as a power adapter.

The control body may include any of a number of different terminals, electrical connectors or the like to connect to a suitable charger, and in some examples, to connect to other peripherals for communication. More specific suitable examples include direct current (DC) connectors such as cylindrical connectors, cigarette lighter connectors and USB connectors including those specified by USB 1.x (e.g., Type A, Type B), USB 2.0 and its updates and additions (e.g., Mini A, Mini B, Mini AB, Micro A, Micro B, Micro AB) and USB 3.x (e.g., Type A, Type B, Micro B, Micro AB, Type C), proprietary connectors such as Apple's Lightning connector, and the like. The control body may directly connect with the charger or other peripheral, or the two may connect via an appropriate cable that also has suitable connectors. In examples in which the two are connected by cable, the control body and charger or other peripheral may have the same or different type of connector with the cable having the one type of connector or both types of connectors.

In examples involving induction-powered charging, the aerosol delivery device may be equipped with inductive wireless charging technology and include an induction receiver to connect with a wireless charger, charging pad or the like that includes an induction transmitter and uses inductive wireless charging (including for example, wireless charging according to the Qi wireless charging standard from the Wireless Power Consortium (WPC)). Or the power source may be recharged from a wireless radio frequency (RF) based charger. An example of an inductive wireless charging system is described in U.S. Pat. App. Pub. No. 2017/0112196 to Sur et al., which is incorporated herein by reference in its entirety. Further, in some implementations in the case of an electronic cigarette, the cartridge may comprise a single-use cartridge, as disclosed in U.S. Pat. No. 8,910,639 to Chang et al., which is incorporated herein by reference.

One or more connections may be employed to connect the power source to a recharging technology, and some may involve a charging case, cradle, dock, sleeve or the like. More specifically, for example, the control body may be configured to engage a cradle that includes a USB connector to connect to a power supply. Or in another example, the control body may be configured to fit within and engage a sleeve that includes a USB connector to connect to a power supply. In these and similar examples, the USB connector may connect directly to the power source, or the USB connector may connect to the power source via a suitable power adapter.

Examples of power sources are described in U.S. Pat. No. 9,484,155 to Peckerar et al.; and U.S. Pat. App. Pub. No. 2017/0112191 to Sur et al., filed Oct. 21, 2015, the disclosures of which are incorporated herein by reference. Other examples of a suitable power source are provided in U.S. Pat. App. Pub. No. 2014/0283855 to Hawes et al., U.S. Pat. App. Pub. No. 2014/0014125 to Fernando et al., U.S. Pat. App. Pub. No. 2013/0243410 to Nichols et al., U.S. Pat. App. Pub. No. 2010/0313901 to Fernando et al., and U.S. Pat. No. 9,439,454 to Fernando et al., all of which are incorporated herein by reference. With respect to the flow sensor, representative current regulating components and other current controlling components including various microcontrollers, sensors, and switches for aerosol delivery devices are described in U.S. Pat. No. 4,735,217 to Gerth et al.; U.S. Pat. Nos. 4,922,901, 4,947,874, and 4,947,875, all to Brooks et al.; U.S. Pat. No. 5,372,148 to McCafferty et al.; U.S. Pat. No. 6,040,560 to Fleischhauer et al.; U.S. Pat. No. 7,040,314 to Nguyen et al.; U.S. Pat. No. 8,205,622 to Pan; U.S. Pat. No. 8,881,737 to Collet et al.; U.S. Pat. No. 9,423,152 to Ampolini et al.; U.S. Pat. No. 9,439,454 to Fernando et al.; and U.S. Pat. App. Pub. No. 2015/0257445 to Henry et al., all of which are incorporated herein by reference.

An input device may be included with the aerosol delivery device (and may replace or supplement a flow sensor). The input may be included to allow a user to control functions of the device and/or for output of information to a user. Any component or combination of components may be utilized as an input for controlling the function of the device. Suitable input devices include pushbuttons, touch switches or other touch sensitive surfaces. For example, one or more pushbuttons may be used as described in U.S. Pub. No. 2015/0245658 to Worm et al., which is incorporated herein by reference. Likewise, a touchscreen may be used as described in U.S. patent application Ser. No. 14/643,626, filed Mar. 10, 2015, to Sears et al., which is incorporated herein by reference.

As a further example, components adapted for gesture recognition based on specified movements of the aerosol delivery device may be used as an input device. See U.S. Pub. 2016/0158782 to Henry et al., which is incorporated herein by reference. As still a further example, a capacitive sensor may be implemented on the aerosol delivery device to enable a user to provide input, such as by touching a surface of the device on which the capacitive sensor is implemented. In another example, a sensor capable of detecting a motion associated with the device (e.g., accelerometer, gyroscope, photoelectric proximity sensor, etc.) may be implemented on the aerosol delivery device to enable a user to provide input. Examples of suitable sensors are described in U.S. Pat. App. Pub. No. 2018/0132528 to Sur et al.; and U.S. Pat. App. Pub. No. 2016/0158782 to Henry et al., which are incorporated herein by reference.

As indicated above, the aerosol delivery device may include various electronics such as at least one control component. A suitable control component may include a number of electronic components, and in some examples may be formed of a circuit board such as a printed circuit board (PCB). In some examples, the electronic components include processing circuitry configured to perform data processing, application execution, or other processing, control or management services according to one or more example implementations. The processing circuitry may include a processor embodied in a variety of forms such as at least one processor core, microprocessor, coprocessor, controller, microcontroller or various other computing or processing devices including one or more integrated circuits such as, for example, an ASIC (application specific integrated circuit), an FPGA (field programmable gate array), some combination thereof, or the like. In some examples, the processing circuitry may include memory coupled to or integrated with the processor, and which may store data, computer program instructions executable by the processor, some combination thereof, or the like.

In some examples, the control component may include one or more input/output peripherals, which may be coupled to or integrated with the processing circuitry. More particularly, the control component may include a communication interface to enable wireless communication with one or more networks, computing devices or other appropriately-enabled devices. Examples of suitable communication interfaces are disclosed in U.S. Pat. App. Pub. No. 2016/0261020 to Marion et al., the content of which is incorporated herein by reference. Another example of a suitable communication interface is the CC3200 single chip wireless microcontroller unit (MCU) from Texas Instruments. And examples of suitable manners according to which the aerosol delivery device may be configured to wirelessly communicate are disclosed in U.S. Pat. App. Pub. No. 2016/0007651 to Ampolini et al.; and U.S. Pat. App. Pub. No. 2016/0219933 to Henry, Jr. et al., each of which is incorporated herein by reference.

Still further components can be utilized in the aerosol delivery device of the present disclosure. One example of a suitable component is an indicator such as light-emitting diodes (LEDs), quantum dot-based LEDs or the like, which may be illuminated with use of the aerosol delivery device. Examples of suitable LED components, and the configurations and uses thereof, are described in U.S. Pat. No. 5,154,192 to Sprinkel et al.; U.S. Pat. No. 8,499,766 to Newton; U.S. Pat. No. 8,539,959 to Scatterday; and U.S. Pat. No. 9,451,791 to Sears et al., all of which are incorporated herein by reference.

Other indices of operation are also encompassed by the present disclosure. For example, visual indicators of operation also include changes in light color or intensity to show progression of the smoking experience. Tactile (haptic) indicators of operation such as vibration motors, and sound (audio) indicators of operation such as speakers, are similarly encompassed by the disclosure. Moreover, combinations of such indicators of operation also are suitable to be used in a single smoking article. According to another aspect, the aerosol delivery device may include one or more indicators or indicia, such as, for example, a display configured to provide information corresponding to the operation of the smoking article such as, for example, the amount of power remaining in the power source, progression of the smoking experience, indication corresponding to activating an aerosol production component, and/or the like.

Yet other components are also contemplated. For example, U.S. Pat. No. 5,154,192 to Sprinkel et al. discloses indicators for smoking articles; U.S. Pat. No. 5,261,424 to Sprinkel, Jr. discloses piezoelectric sensors that can be associated with the mouth-end of a device to detect user lip activity associated with taking a draw and then trigger heating of a heating device; U.S. Pat. No. 5,372,148 to McCafferty et al. discloses a puff sensor for controlling energy flow into a heating load array in response to pressure drop through a mouthpiece; U.S. Pat. No. 5,967,148 to Harris et al. discloses receptacles in a smoking device that include an identifier that detects a non-uniformity in infrared transmissivity of an inserted component and a controller that executes a detection routine as the component is inserted into the receptacle; U.S. Pat. No. 6,040,560 to Fleischhauer et al. describes a defined executable power cycle with multiple differential phases; U.S. Pat. No. 5,934,289 to Watkins et al. discloses photonic-optronic components; U.S. Pat. No. 5,954,979 to Counts et al. discloses means for altering draw resistance through a smoking device; U.S. Pat. No. 6,803,545 to Blake et al. discloses specific battery configurations for use in smoking devices; U.S. Pat. No. 7,293,565 to Griffen et al. discloses various charging systems for use with smoking devices; U.S. Pat. No. 8,402,976 to Fernando et al. discloses computer interfacing means for smoking devices to facilitate charging and allow computer control of the device; U.S. Pat. No. 8,689,804 to Fernando et al. discloses identification systems for smoking devices; and PCT Pat. App. Pub. No. WO 2010/003480 by Flick discloses a fluid flow sensing system indicative of a puff in an aerosol generating system; all of the foregoing disclosures being incorporated herein by reference.

Further examples of components related to electronic aerosol delivery articles and disclosing materials or components that may be used in the present article include U.S. Pat. No. 4,735,217 to Gerth et al.; U.S. Pat. No. 5,249,586 to Morgan et al.; U.S. Pat. No. 5,666,977 to Higgins et al.; U.S. Pat. No. 6,053,176 to Adams et al.; U.S. Pat. No. 6,164,287 to White; U.S. Pat. No. 6,196,218 to Voges; U.S. Pat. No. 6,810,883 to Felter et al.; U.S. Pat. No. 6,854,461 to Nichols; U.S. Pat. No. 7,832,410 to Hon; U.S. Pat. No. 7,513,253 to Kobayashi; U.S. Pat. No. 7,896,006 to Hamano; U.S. Pat. No. 6,772,756 to Shayan; U.S. Pat. Nos. 8,156,944 and 8,375,957 to Hon; U.S. Pat. No. 8,794,231 to Thorens et al.; U.S. Pat. No. 8,851,083 to Oglesby et al.; U.S. Pat. Nos. 8,915,254 and 8,925,555 to Monsees et al.; U.S. Pat. No. 9,220,302 to DePiano et al.; U.S. Pat. App. Pub. Nos. 2006/0196518 and 2009/0188490 to Hon; U.S. Pat. App. Pub. No. 2010/0024834 to Oglesby et al.; U.S. Pat. App. Pub. No. 2010/0307518 to Wang; PCT Pat. App. Pub. No. WO 2010/091593 to Hon; and PCT Pat. App. Pub. No. WO 2013/089551 to Foo, each of which is incorporated herein by reference. Further, U.S. Pat. App. Pub. No. 2017/0099877 to Worm et al., discloses capsules that may be included in aerosol delivery devices and fob-shape configurations for aerosol delivery devices, and is incorporated herein by reference. A variety of the materials disclosed by the foregoing documents may be incorporated into the present devices in various implementations, and all of the foregoing disclosures are incorporated herein by reference.

Yet other features, controls or components that can be incorporated into aerosol delivery devices of the present disclosure are described in U.S. Pat. No. 5,967,148 to Harris et al.; U.S. Pat. No. 5,934,289 to Watkins et al.; U.S. Pat. No. 5,954,979 to Counts et al.; U.S. Pat. No. 6,040,560 to Fleischhauer et al.; U.S. Pat. No. 8,365,742 to Hon; U.S. Pat. No. 8,402,976 to Fernando et al.; U.S. Pat. App. Pub. No. 2005/0016550 to Katase; U.S. Pat. No. 8,689,804 to Fernando et al.; U.S. Pat. App. Pub. No. 2013/0192623 to Tucker et al.; U.S. Pat. No. 9,427,022 to Leven et al.; U.S. Pat. App. Pub. No. 2013/0180553 to Kim et al.; U.S. Pat. App. Pub. No. 2014/0000638 to Sebastian et al.; U.S. Pat. App. Pub. No. 2014/0261495 to Novak et al.; and U.S. Pat. No. 9,220,302 to DePiano et al., all of which are incorporated herein by reference.

FIGS. 1 and 2 illustrate implementations of an aerosol delivery device including a control body and a cartridge in the case of an electronic cigarette. In this regard, FIGS. 1 and 2 illustrate an aerosol delivery device 100 according to an example implementation of the present disclosure. As indicated, the aerosol delivery device may include a control body 102 and a cartridge 104. The control body and the cartridge can be permanently or detachably aligned in a functioning relationship. In this regard, FIG. 1 illustrates a perspective view of the aerosol delivery device in a coupled configuration, whereas FIG. 2 illustrates a partially cut-away side view of the aerosol delivery device in a decoupled configuration. The aerosol delivery device may, for example, be substantially rod-like, substantially tubular shaped, or substantially cylindrically shaped in some implementations when the control body and the cartridge are in an assembled configuration.

The control body 102 and the cartridge 104 can be configured to engage one another by a variety of connections, such as a press fit (or interference fit) connection, a threaded connection, a magnetic connection, or the like. As such, the control body may include a first engaging element (e.g., a coupler) that is adapted to engage a second engaging element (e.g., a connector) on the cartridge. The first engaging element and the second engaging element may be reversible. As an example, either of the first engaging element or the second engaging element may be a male thread, and the other may be a female thread. As a further example, either the first engaging element or the second engaging element may be a magnet, and the other may be a metal or a matching magnet. In particular implementations, engaging elements may be defined directly by existing components of the control body and the cartridge. For example, the housing of the control body may define a cavity at an end thereof that is configured to receive at least a portion of the cartridge (e.g., a storage tank or other shell-forming element of the cartridge). In particular, a storage tank of the cartridge may be at least partially received within the cavity of the control body while a mouthpiece of the cartridge remains exposed outside of the cavity of the control body. The cartridge may be retained within the cavity formed by the control body housing, such as by an interference fit (e.g., through use of detents and/or other features creating an interference engagement between an outer surface of the cartridge and an interior surface of a wall forming the control body cavity), by a magnetic engagement (e.g., though use of magnets and/or magnetic metals positioned within the cavity of the control body and positioned on the cartridge), or by other suitable techniques.

As seen in the cut-away view illustrated in FIG. 2, the control body 102 and cartridge 104 each include a number of respective components. The components illustrated in FIG. 2 are representative of the components that may be present in a control body and cartridge and are not intended to limit the scope of components that are encompassed by the present disclosure. As shown, for example, the control body can be formed of a housing 206 (sometimes referred to as a control body shell) that can include a control component 208 (e.g., processing circuitry, etc.), a flow sensor 210, a power source 212 (e.g., battery, supercapacitor), and an indicator 214 (e.g., LED, quantum dot-based LED), and such components can be variably aligned. The power source may be rechargeable, and the control component may include a switch and processing circuitry coupled to the flow sensor and the switch. The processing circuitry may be configured to determine a difference between measurements of atmospheric air pressure from the flow sensor, and a reference atmospheric air pressure. In some implementations, the flow sensor is an absolute pressure sensor.

The cartridge 104 can be formed of a housing 216 (sometimes referred to as the cartridge shell) enclosing a reservoir 218 configured to retain the aerosol precursor composition, and including a heating element 220 (aerosol production component). In various configurations, this structure may be referred to as a tank; and accordingly, the terms "cartridge," "tank" and the like may be used interchangeably to refer to a shell or other housing enclosing a reservoir for aerosol precursor composition, and, in some implementations, including a heating element or other aerosol production component.

As shown, in some examples, the reservoir 218 may be in fluid communication with a liquid transport element 222 adapted to wick or otherwise transport an aerosol precursor composition stored in the reservoir housing to the heating element 220. In some examples, a valve may be positioned between the reservoir and heating element, and configured to control an amount of aerosol precursor composition passed or delivered from the reservoir to the heating element.

Various examples of materials configured to produce heat when electrical current is applied therethrough may be employed to form the heating element 220. The heating element in these examples may be a resistive heating element such as a wire coil, micro heater or the like. Example materials from which the heating element may be formed include Kanthal (FeCrAl), nichrome, nickel, stainless steel, indium tin oxide, tungsten, molybdenum disilicide ($MoSi_2$), molybdenum silicide (MoSi), molybdenum disilicide doped with aluminum ($Mo(Si,Al)_2$), titanium, platinum, silver, palladium, alloys of silver and palladium, graphite and graphite-based materials (e.g., carbon-based foams and yarns), conductive inks, boron doped silica, and ceramics (e.g., positive or negative temperature coefficient ceramics). The heating element may be resistive heating element or a heating element configured to generate heat through induction. The heating element may be coated by heat conductive ceramics such as aluminum nitride, silicon carbide, beryllium oxide, alumina, silicon nitride, or their composites. Example implementations of heating elements useful in aerosol delivery devices according to the present disclosure are further described below, and can be incorporated into devices such as those described herein.

An opening 224 may be present in the housing 216 (e.g., at the mouth end) to allow for egress of formed aerosol from the cartridge 104.

The cartridge 104 also may include one or more electronic components 226, which may include an integrated circuit, a memory component (e.g., EEPROM, flash memory), a sensor, or the like. The electronic components may be adapted to communicate with the control component 208 and/or with an external device by wired or wireless means. The electronic components may be positioned anywhere within the cartridge or a base 228 thereof.

Although the control component 208 and the flow sensor 210 are illustrated separately, it is understood that various electronic components including the control component and the flow sensor may be combined on a circuit board (e.g., PCB) that supports and electrically connects the electronic components. Further, the circuit board may be positioned horizontally relative the illustration of FIG. 1 in that the circuit board can be lengthwise parallel to the central axis of the control body. In some examples, the air flow sensor may comprise its own circuit board or other base element to which it can be attached. In some examples, a flexible circuit board may be utilized. A flexible circuit board may be configured into a variety of shapes, include substantially tubular shapes. In some examples, a flexible circuit board may be combined with, layered onto, or form part or all of a heater substrate.

The control body 102 and the cartridge 104 may include components adapted to facilitate a fluid engagement therebetween. As illustrated in FIG. 2, the control body can include a coupler 230 having a cavity 232 therein. The base 228 of the cartridge can be adapted to engage the coupler and can include a projection 234 adapted to fit within the cavity. Such engagement can facilitate a stable connection between the control body and the cartridge as well as establish an electrical connection between the power source 212 and control component 208 in the control body and the heating element 220 in the cartridge. Further, the housing 206 can include an air intake 236, which may be a notch in the housing where it connects to the coupler that allows for passage of ambient air around the coupler and into the housing where it then passes through the cavity 232 of the coupler and into the cartridge through the projection 234.

A coupler and a base useful according to the present disclosure are described in U.S. Pat. App. Pub. No. 2014/0261495 to Novak et al., which is incorporated herein by reference. For example, the coupler 230 as seen in FIG. 2 may define an outer periphery 238 configured to mate with an inner periphery 240 of the base 228. In one example the inner periphery of the base may define a radius that is substantially equal to, or slightly greater than, a radius of the outer periphery of the coupler. Further, the coupler may define one or more protrusions 242 at the outer periphery configured to engage one or more recesses 244 defined at the inner periphery of the base. However, various other examples of structures, shapes and components may be employed to couple the base to the coupler. In some examples the connection between the base of the cartridge 104 and the coupler of the control body 102 may be substantially permanent, whereas in other examples the connection therebetween may be releasable such that, for example, the control body may be reused with one or more additional cartridges that may be disposable and/or refillable.

The reservoir 218 illustrated in FIG. 2 can be a container or can be a fibrous reservoir, as presently described. For example, the reservoir can comprise one or more layers of nonwoven fibers substantially formed into the shape of a tube encircling the interior of the housing 216, in this example. An aerosol precursor composition can be retained in the reservoir. Liquid components, for example, can be sportively retained by the reservoir. The reservoir can be in fluid connection with the liquid transport element 222. The liquid transport element can transport the aerosol precursor composition stored in the reservoir via capillary action—or via a micro pump—to the heating element 220 that is in the form of a metal wire coil in this example. As such, the heating element is in a heating arrangement with the liquid transport element.

In some examples, a microfluidic chip may be embedded in the reservoir 218, and the amount and/or mass of aerosol precursor composition delivered from the reservoir may be controlled by a micro pump, such as one based on microelectromechanical systems (MEMS) technology. Other example implementations of reservoirs and transport elements useful in aerosol delivery devices according to the present disclosure are further described herein, and such reservoirs and/or transport elements can be incorporated into devices such as those described herein. In particular, specific combinations of heating members and transport elements as further described herein may be incorporated into devices such as those described herein.

In use, when a user draws on the aerosol delivery device 100, airflow is detected by the flow sensor 210, and the heating element 220 is activated to vaporize components of the aerosol precursor composition. Drawing upon the mouth end of the aerosol delivery device causes ambient air to enter the air intake 236 and pass through the cavity 232 in the coupler 230 and the central opening in the projection 234 of the base 228. In the cartridge 104, the drawn air combines with the formed vapor to form an aerosol. The aerosol is whisked, aspirated or otherwise drawn away from the heating element and out the opening 224 in the mouth end of the aerosol delivery device.

For further detail regarding implementations of an aerosol delivery device including a control body and a cartridge in the case of an electronic cigarette, see the above-cited U.S. patent application Ser. No. 15/836,086 to Sur; and U.S. patent application Ser. No. 15/916,834 to Sur et al.; as well as U.S. patent application Ser. No. 15/916,696 to Sur, filed Mar. 9, 2018, which is also incorporated herein by reference.

FIGS. 3-6 illustrate implementations of an aerosol delivery device including a control body and an aerosol source member in the case of a heat-not-burn device. More specifically, FIG. 3 illustrates an aerosol delivery device 300 according to an example implementation of the present disclosure. The aerosol delivery device may include a control body 302 and an aerosol source member 304. In various implementations, the aerosol source member and the control body can be permanently or detachably aligned in a functioning relationship. In this regard, FIG. 3 illustrates the aerosol delivery device in a coupled configuration, whereas FIG. 4 illustrates the aerosol delivery device in a decoupled configuration.

As shown in FIG. 4, in various implementations of the present disclosure, the aerosol source member 304 may comprise a heated end 406, which is configured to be inserted into the control body 302, and a mouth end 408, upon which a user draws to create the aerosol. In various implementations, at least a portion of the heated end may include an aerosol precursor composition 410.

In various implementations, the aerosol source member 304, or a portion thereof, may be wrapped in an exterior overwrap material 412, which may be formed of any material useful for providing additional structure and/or support for the aerosol source member. In various implementations, the exterior overwrap material may comprise a material that resists transfer of heat, which may include a paper or other fibrous material, such as a cellulose material. The exterior overwrap material may also include at least one filler material imbedded or dispersed within the fibrous material. In various implementations, the filler material may have the form of water insoluble particles. Additionally, the filler material may incorporate inorganic components. In various implementations, the exterior overwrap may be formed of multiple layers, such as an underlying, bulk layer and an overlying layer, such as a typical wrapping paper in a cigarette. Such materials may include, for example, lightweight "rag fibers" such as flax, hemp, sisal, rice straw, and/or esparto. The exterior overwrap may also include a material typically used in a filter element of a conventional cigarette, such as cellulose acetate. Further, an excess length of the overwrap at the mouth end 408 of the aerosol source member may function to simply separate the aerosol precursor composition 410 from the mouth of a consumer or to provide space for positioning of a filter material, as described below, or to affect draw on the article or to affect flow characteristics of the vapor or aerosol leaving the device during draw. Further discussion relating to the configurations for overwrap materials that may be used with the present disclosure may be found in the above-cited U.S. Pat. No. 9,078,473 to Worm et al.

In various implementations other components may exist between the aerosol precursor composition 410 and the mouth end 408 of the aerosol source member 304, wherein the mouth end may include a filter 414, which may, for example, be made of a cellulose acetate or polypropylene material. The filter may additionally or alternatively contain strands of tobacco containing material, such as described in U.S. Pat. No. 5,025,814 to Raker et al., which is incorporated herein by reference in its entirety. In various implementations, the filter may increase the structural integrity of the mouth end of the aerosol source member, and/or provide filtering capacity, if desired, and/or provide resistance to draw. In some implementations one or any combination of the following may be positioned between the aerosol precursor composition and the mouth end: an air gap; phase change materials for cooling air; flavor releasing media; ion exchange fibers capable of selective chemical adsorption; aerogel particles as filter medium; and other suitable materials.

Various implementations of the present disclosure employ one or more conductive heating elements to heat the aerosol precursor composition 410 of the aerosol source member 304. In various implementations, the heating element may be provided in a variety forms, such as in the form of a foil, a foam, a mesh, a hollow ball, a half ball, discs, spirals, fibers, wires, films, yarns, strips, ribbons, or cylinders. Such heating elements often comprise a metal material and are configured to produce heat as a result of the electrical resistance associated with passing an electrical current therethrough. Such resistive heating elements may be positioned in direct contact with, or in proximity to, the aerosol source member and particularly, the aerosol precursor composition of the aerosol source member. The heating element may be located in the control body and/or the aerosol source member. In various implementations, the aerosol precursor composition may include components (i.e., heat conducting constituents) that are imbedded in, or otherwise part of, the substrate portion that may serve as, or facilitate the function of, the heating assembly. Some examples of various heating members and elements are described in U.S. Pat. No. 9,078,473 to Worm et al.

Some non-limiting examples of various heating element configurations include configurations in which a heating element is placed in proximity with the aerosol source member 304. For instance, in some examples, at least a portion of a heating element may surround at least a portion of an aerosol source member. In other examples, one or more heating elements may be positioned adjacent an exterior of an aerosol source member when inserted in the control body 302. In other examples, at least a portion of a heating element may penetrate at least a portion of an aerosol source member (such as, for example, one or more prongs and/or spikes that penetrate an aerosol source member), when the aerosol source member is inserted into the control body. In some instances, the aerosol precursor composition may include a structure in contact with, or a plurality of beads or particles imbedded in, or otherwise part of, the aerosol precursor composition that may serve as, or facilitate the function of the heating element.

FIG. 5 illustrates a front view of an aerosol delivery device 300 according to an example implementation of the present disclosure, and FIG. 6 illustrates a sectional view through the aerosol delivery device of FIG. 5. In particular, the control body 302 of the depicted implementation may comprise a housing 516 that includes an opening 518 defined in an engaging end thereof, a flow sensor 520 (e.g., a puff sensor or pressure switch), a control component 522 (e.g., processing circuitry, etc.), a power source 524 (e.g., battery, supercapacitor), and an end cap that includes an indicator 526 (e.g., a LED). The power source may be rechargeable, and the control component may include a switch and processing circuitry coupled to the flow sensor and the switch. The processing circuitry may be configured to determine a difference between measurements of atmospheric air pressure from the flow sensor, and a reference atmospheric air pressure.

In one implementation, the indicator 526 may comprise one or more LEDs, quantum dot-based LEDs or the like. The indicator can be in communication with the control component 522 and be illuminated, for example, when a user draws on the aerosol source member 304, when coupled to the control body 302, as detected by the flow sensor 520.

The control body 302 of the depicted implementation includes one or more heating assemblies 528 (individually or collectively referred to a heating assembly) configured to heat the aerosol precursor composition 410 of the aerosol source member 304. Although the heating assembly of various implementations of the present disclosure may take a variety of forms, in the particular implementation depicted in FIGS. 5 and 6, the heating assembly comprises an outer cylinder 530 and a heating element 532 (aerosol production component), which in this implementation comprises a plurality of heater prongs that extend from a receiving base 534 (in various configurations, the heating assembly or more specifically the heater prongs may be referred to as a heater). In the depicted implementation, the outer cylinder comprises a double-walled vacuum tube constructed of stainless steel so as to maintain heat generated by the heater prongs within the outer cylinder, and more particularly, maintain heat generated by heater prongs within the aerosol precursor composition. In various implementations, the heater prongs may be constructed of one or more conductive materials, including, but not limited to, copper, aluminum, platinum, gold, silver, iron, steel, brass, bronze, graphite, or any combination thereof.

As illustrated, the heating assembly 528 may extend proximate an engagement end of the housing 516, and may be configured to substantially surround a portion of the heated end 406 of the aerosol source member 304 that includes the aerosol precursor composition 410. In such a manner, the heating assembly may define a generally tubular configuration. As illustrated in FIGS. 5 and 6, the heating element 532 (e.g., plurality of heater prongs) is surrounded by the outer cylinder 530 to create a receiving chamber 536. In such a manner, in various implementations the outer cylinder may comprise a nonconductive insulating material and/or construction including, but not limited to, an insulating polymer (e.g., plastic or cellulose), glass, rubber, ceramic, porcelain, a double-walled vacuum structure, or any combinations thereof.

In some implementations, one or more portions or components of the heating assembly 528 may be combined with, packaged with, and/or integral with (e.g., embedded within) the aerosol precursor composition 410. For example, in some implementations the aerosol precursor composition may be formed of a material as described above and may include one or more conductive materials mixed therein. In some of these implementations, contacts may be connected directly to the aerosol precursor composition such that, when the aerosol source member is inserted into the receiving chamber of the control body, the contacts make electrical connection with the electrical energy source. Alternatively, the contacts may be integral with the electrical energy source and may extend into the receiving chamber such that, when the aerosol source member is inserted into the receiving chamber of the control body, the contacts make electrical connection with the aerosol precursor composition. Because of the presence of the conductive material in the aerosol precursor composition, the application of power from the electrical energy source to the aerosol precursor composition allows electrical current to flow and thus produce heat from the conductive material. Thus, in some implementations the heating element may be described as being integral with the aerosol precursor composition. As a non-limiting example, graphite or other suitable, conductive material may be mixed with, embedded in, or otherwise present directly on or within the material forming the aerosol precursor composition to make the heating element integral with the medium.

As noted above, in the illustrated implementation, the outer cylinder 530 may also serve to facilitate proper positioning of the aerosol source member 304 when the aerosol source member is inserted into the housing 516. In various implementations, the outer cylinder of the heating assembly 528 may engage an internal surface of the housing to provide for alignment of the heating assembly with respect to the housing. Thereby, as a result of the fixed coupling between the heating assembly, a longitudinal axis of the heating assembly may extend substantially parallel to a longitudinal axis of the housing. In particular, the support cylinder may extend from the opening 518 of the housing to the receiving base 534 to create the receiving chamber 536.

The heated end 406 of the aerosol source member 304 is sized and shaped for insertion into the control body 302. In various implementations, the receiving chamber 536 of the control body may be characterized as being defined by a wall with an inner surface and an outer surface, the inner surface defining the interior volume of the receiving chamber. For example, in the depicted implementations, the outer cylinder 530 defines an inner surface defining the interior volume of the receiving chamber. In the illustrated implementation, an inner diameter of the outer cylinder may be slightly larger than or approximately equal to an outer diameter of a corresponding aerosol source member (e.g., to create a sliding fit) such that the outer cylinder is configured to guide the aerosol source member into the proper position (e.g., lateral position) with respect to the control body. Thus, the largest outer diameter (or other dimension depending upon the specific cross-sectional shape of the implementations) of the aerosol source member may be sized to be less than the inner diameter (or other dimension) at the inner surface of the wall of the open end of the receiving chamber in the control body. In some implementations, the difference in the respective diameters may be sufficiently small so that the aerosol source member fits snugly into the receiving chamber, and frictional forces prevent the aerosol source member from being moved without an applied force. On the other hand, the difference may be sufficient to allow the aerosol source member to slide into or out of the receiving chamber without requiring undue force.

In the illustrated implementation, the control body 302 is configured such that when the aerosol source member 304 is inserted into the control body, the heating element 532 (e.g., heater prongs) is located in the approximate radial center of at least a portion of the aerosol precursor composition 410 of the heated end 406 of the aerosol source member. In such a manner, when used in conjunction with a solid or semi-solid aerosol precursor composition, the heater prongs may be in direct contact with the aerosol precursor composition. In other implementations, such as when used in conjunction with an extruded aerosol precursor composition that defines a tube structure, the heater prongs may be located inside of a cavity defined by an inner surface of the extruded tube structure, and would not contact the inner surface of the extruded tube structure.

During use, the consumer initiates heating of the heating assembly 528, and in particular, the heating element 532 that is adjacent the aerosol precursor composition 410 (or a specific layer thereof). Heating of the aerosol precursor composition releases the inhalable substance within the aerosol source member 304 so as to yield the inhalable substance. When the consumer inhales on the mouth end 408 of the aerosol source member, air is drawn into the aerosol source member through an air intake 538 such as openings or apertures in the control body 302. The combination of the drawn air and the released inhalable substance is inhaled by the consumer as the drawn materials exit the mouth end of the aerosol source member. In some implementations, to initiate heating, the consumer may manually actuate a push-button or similar component that causes the heating element of the heating assembly to receive electrical energy from the battery or other energy source. The electrical energy may be supplied for a pre-determined length of time or may be manually controlled.

In some implementations, flow of electrical energy does not substantially proceed in between puffs on the device 300 (although energy flow may proceed to maintain a baseline temperature greater than ambient temperature—e.g., a temperature that facilitates rapid heating to the active heating temperature). In the depicted implementation, however, heating is initiated by the puffing action of the consumer through use of one or more sensors, such as flow sensor 520. Once the puff is discontinued, heating will stop or be reduced. When the consumer has taken a sufficient number of puffs so as to have released a sufficient amount of the inhalable substance (e.g., an amount sufficient to equate to a typical smoking experience), the aerosol source member 304 may be removed from the control body 302 and discarded. In some implementations, further sensing elements, such as capacitive sensing elements and other sensors, may be used as discussed in U.S. patent application Ser. No. 15/707,461 to Phillips et al., which is incorporated herein by reference.

In various implementations, the aerosol source member 304 may be formed of any material suitable for forming and maintaining an appropriate conformation, such as a tubular shape, and for retaining therein the aerosol precursor composition 410. In some implementations, the aerosol source member may be formed of a single wall or, in other implementations, multiple walls, and may be formed of a material (natural or synthetic) that is heat resistant so as to retain its structural integrity—e.g., does not degrade—at least at a temperature that is the heating temperature provided by the electrical heating element, as further discussed herein. While in some implementations, a heat resistant polymer may be used, in other implementations, the aerosol source member may be formed from paper, such as a paper that is substantially straw-shaped. As further discussed herein, the aerosol source member may have one or more layers associated therewith that function to substantially prevent movement of vapor therethrough. In one example implementation, an aluminum foil layer may be laminated to one surface of the aerosol source member. Ceramic materials also may be used. In further implementations, an insulating material may be used so as not to unnecessarily move heat away from the aerosol precursor composition. Further example types of components and materials that may be used to provide the functions described above or be used as alternatives to the materials and components noted above can be those of the types set forth in U.S. Pat. App. Pub. Nos. 2010/00186757 to Crooks et al., 2010/00186757 to Crooks et al., and 2011/0041861 to Sebastian et al., all of which are incorporated herein by reference.

In the depicted implementation, the control body 302 includes a control component 522 that controls the various functions of the aerosol delivery device 300, including providing power to the electrical heating element 532. For example, the control component may include processing circuitry (which may be connected to further components, as further described herein) that, is connected by electrically conductive wires (not shown) to the power source 524. In various implementations, the processing circuitry may control when and how the heating assembly 528, and particularly the heater prongs, receives electrical energy to heat the aerosol precursor composition 410 for release of the inhalable substance for inhalation by a consumer. In some implementations, such control may be activated by a flow sensor 520 as described in greater detail above.

As seen in FIGS. 5 and 6, the heating assembly 528 of the depicted implementation comprises an outer cylinder 530 and a heating element 532 (e.g., plurality of heater prongs) that extend from a receiving base 534. In some implementations, such as those wherein the aerosol precursor composition 410 comprises a tube structure, the heater prongs may be configured to extend into a cavity defined by the inner surface of the aerosol precursor composition. In other implementations, such as the depicted implementation wherein the aerosol precursor composition comprises a solid or semi-solid, the plurality of heater prongs are configured to penetrate into the aerosol precursor composition contained in the heated end 406 of the aerosol source member 304 when the aerosol source member is inserted into the control body 302. In such implementations, one or more of the components of the heating assembly, including the heater prongs and/or the receiving base, may be constructed of a non-stick or stick-resistant material, for example, certain aluminum, copper, stainless steel, carbon steel, and ceramic materials. In other implementations, one or more of the components of the heating assembly, including the heater prongs and/or the receiving base, may include a non-stick coating, including, for example, a polytetrafluoroethylene (PTFE) coating, such as Teflon®, or other coatings, such as a stick-resistant enamel coating, or a ceramic coating, such as Grebion®, or Thermolon™, or a ceramic coating, such as Greblon®, or Thermolon™.

In addition, although in the depicted implementation there are multiple heater prongs 532 that are substantially equally distributed about the receiving base 534, it should be noted that in other implementations, any number of heater prongs may be used, including as few as one, with any other suitable spatial configuration. Furthermore, in various implementations the length of the heater prongs may vary. For example, in some implementations the heater prongs may comprise small projections, while in other implementations the heater prongs may extend any portion of the length of the receiving chamber 536, including up to about 25%, up to about 50%, up to about 75%, and up to about the full length of the receiving chamber. In still other implementations, the heating assembly 528 may take on other configurations. Examples of other heater configurations that may be adapted for use in the present invention per the discussion provided above can be found in U.S. Pat. No. 5,060,671 to Counts et al., U.S. Pat. No. 5,093,894 to Deevi et al., U.S. Pat. No. 5,224,498 to Deevi et al., U.S. Pat. No. 5,228,460 to Sprinkel Jr., et al., U.S. Pat. No. 5,322,075 to Deevi et al., U.S. Pat. No. 5,353,813 to Deevi et al., U.S. Pat. No. 5,468,936 to Deevi et al., U.S. Pat. No. 5,498,850 to Das, U.S. Pat. No. 5,659,656 to Das, U.S. Pat. No. 5,498,855 to Deevi et al., U.S. Pat. No. 5,530,225 to Hajaligol, U.S. Pat. No. 5,665,262 to Hajaligol, and U.S. Pat. No. 5,573,692 to Das et al.; and U.S. Pat. No. 5,591,368 to Fleischhauer et al., which are incorporated herein by reference.

In various implementations, the control body 302 may include an air intake 538 (e.g., one or more openings or apertures) therein for allowing entrance of ambient air into the interior of the receiving chamber 536. In such a manner, in some implementations the receiving base 534 may also include an air intake. Thus, in some implementations when a consumer draws on the mouth end of the aerosol source member 304, air can be drawn through the air intake of the control body and the receiving base into the receiving chamber, pass into the aerosol source member, and be drawn through the aerosol precursor composition 410 of the aerosol source member for inhalation by the consumer. In some implementations, the drawn air carries the inhalable substance through the optional filter 414 and out of an opening at the mouth end 408 of the aerosol source member. With the heating element 532 positioned inside the aerosol precursor composition, the heater prongs may be activated to heat the aerosol precursor composition and cause release of the inhalable substance through the aerosol source member.

As described above with reference to FIGS. 5 and 6 in particular, various implementations of the present disclosure employ a conductive heater to heat the aerosol precursor composition 410. As also indicated above, various other implementations employ an induction heater to heat the aerosol precursor composition. In some of these implementations, the heating assembly 528 may be configured as an induction heater that comprises a transformer with an induction transmitter and an induction receiver. In implementations in which the heating assembly is configured as the induction heater, the outer cylinder 530 may be configured as the induction transmitter, and the heating element 532 (e.g., plurality of heater prongs) that extend from the receiving base 534 may be configured as the induction receiver. In various implementations, one or both of the induction transmitter and induction receiver may be located in the control body 302 and/or the aerosol source member 304.

In various implementations, the outer cylinder 530 and heating element 532 as the induction transmitter and induction receiver may be constructed of one or more conductive materials, and in further implementations the induction receiver may be constructed of a ferromagnetic material including, but not limited to, cobalt, iron, nickel, and combinations thereof. In one example implementation, the foil material is constructed of a conductive material and the heater prongs are constructed of a ferromagnetic material. In various implementations, the receiving base may be constructed of a non-conductive and/or insulating material.

The outer cylinder 530 as the induction transmitter may include a laminate with a foil material that surrounds a support cylinder. In some implementations, the foil material may include an electrical trace printed thereon, such as, for example, one or more electrical traces that may, in some implementations, form a helical coil pattern when the foil material is positioned around the heating element 532 as the induction receiver. The foil material and support cylinder may each define a tubular configuration. The support cylinder may be configured to support the foil material such that the foil material does not move into contact with, and thereby short-circuit with, the heater prongs. In such a manner, the support cylinder may comprise a nonconductive material, which may be substantially transparent to an oscillating magnetic field produced by the foil material. In various implementations, the foil material may be imbedded in, or otherwise coupled to, the support cylinder. In the illustrated implementation, the foil material is engaged with an outer surface of the support cylinder; however, in other implementations, the foil material may be positioned at an inner surface of the support cylinder or be fully imbedded in the support cylinder.

The foil material of the outer cylinder 530 may be configured to create an oscillating magnetic field (e.g., a magnetic field that varies periodically with time) when alternating current is directed through it. The heater prongs of the heating element 532 may be at least partially located or received within the outer cylinder and include a conductive material. By directing alternating current through the foil material, eddy currents may be generated in the heater prongs via induction. The eddy currents flowing through the resistance of the material defining the heater prongs may heat it by Joule heating (i.e., through the Joule effect). The heater prongs may be wirelessly heated to form an aerosol from the aerosol precursor composition 410 positioned in proximity to the heater prongs.

Other implementations of the aerosol delivery device, control body and aerosol source member are described in the above-cited U.S. patent application Ser. No. 15/916,834 to Sur et al.; U.S. patent application Ser. No. 15/916,696 to Sur; and U.S. pat. app. Ser. No. 15/836,086 to Sur.

FIGS. 7 and 8 illustrate implementations of an aerosol delivery device including a control body and a cartridge in the case of a no-heat-no-burn device. In this regard, FIG. 7 illustrates a side view of an aerosol delivery device 700 including a control body 702 and a cartridge 704, according to various example implementations of the present disclosure. In particular, FIG. 7 illustrates the control body and the cartridge coupled to one another. The control body and the cartridge may be detachably aligned in a functioning relationship.

FIG. 8 more particularly illustrates the aerosol delivery device 700, in accordance with some example implementations. As seen in the cut-away view illustrated therein, again, the aerosol delivery device can comprise a control body 702 and a cartridge 704 each of which include a number of respective components. The components illustrated in FIG. 8 are representative of the components that may be present in a control body and cartridge and are not intended to limit the scope of components that are encompassed by the present disclosure. As shown, for example, the control body can be formed of a control body housing or shell 806 that can include a control component 808 (e.g., processing circuitry, etc.), an input device 810, a power source 812 and an indicator 814 (e.g., LED, quantum dot-based LED), and such components can be variably aligned. Here, a particular example of a suitable control component includes the PIC16(L)F1713/6 microcontrollers from Microchip Technology Inc., which is described in Microchip Technology, Inc., AN2265, *Vibrating Mesh Nebulizer Reference Design* (2016), which is incorporated by reference.

The cartridge 704 can be formed of a housing—referred to at times as a cartridge shell 816—enclosing a reservoir 818 configured to retain the aerosol precursor composition, and including a nozzle 820 having a piezoelectric/piezomagnetic mesh (aerosol production component). Similar to above, in various configurations, this structure may be referred to as a tank.

The reservoir 818 illustrated in FIG. 8 can be a container or can be a fibrous reservoir, as presently described. The reservoir may be in fluid communication with the nozzle 820 for transport of an aerosol precursor composition stored in the reservoir housing to the nozzle. An opening 822 may be present in the cartridge shell 816 (e.g., at the mouthend) to allow for egress of formed aerosol from the cartridge 704.

In some examples, a transport element may be positioned between the reservoir 818 and nozzle 824), and configured to control an amount of aerosol precursor composition passed or delivered from the reservoir to the nozzle. In some examples, a microfluidic chip may be embedded in the cartridge 704, and the amount and/or mass of aerosol precursor composition delivered from the reservoir may be controlled by one or more microfluidic components. One example of a microfluidic component is a micro pump 824, such as one based on microelectromechanical systems (MEMS) technology. Examples of suitable micro pumps include the model MDP2205 micro pump and others from thinXXS Microtechnology AG, the mp5 and mp6 model micro pumps and others from Bartels Mikrotechnik GmbH, and piezoelectric micro pumps from Takasago Fluidic Systems.

As also shown, in some examples, a micro filter 826 may be positioned between the micro pump 824 and nozzle 820 to filter aerosol precursor composition delivered to the nozzle. Like the micro pump, the micro filter is a microfluidic component. Examples of suitable micro filters include flow-through micro filters those manufactured using lab-on-a-chip (LOC) techniques.

In use, when the input device 810 detects user input to activate the aerosol delivery device, the piezoelectric/piezomagnetic mesh is activated to vibrate and thereby draw aerosol precursor composition through the mesh. This forms droplets of aerosol precursor composition that combine with air to form an aerosol. The aerosol is whisked, aspirated or otherwise drawn away from the mesh and out the opening 822 in the mouthend of the aerosol delivery device.

The aerosol delivery device 700 can incorporate the input device 810 such as a switch, sensor or detector for control of supply of electric power to the piezoelectric/piezomagnetic mesh of the nozzle 820 when aerosol generation is desired (e.g., upon draw during use). As such, for example, there is provided a manner or method of turning off power to the mesh when the aerosol delivery device is not being drawn upon during use, and for turning on power to actuate or trigger the production and dispensing of aerosol from the nozzle during draw. Additional representative types of sensing or detection mechanisms, structure and configuration thereof, components thereof, and general methods of operation thereof, are described above and in U.S. Pat. No. 5,261,424 to Sprinkel, Jr., U.S. Pat. No. 5,372,148 to McCafferty et al., and PCT Pat. App. Pub. No. WO 2010/003480 to Hick, all of which are incorporated herein by reference.

For more information regarding the above and other implementations of an aerosol delivery device in the case of a no-heat-no-burn device, see U.S. patent application Ser. No. 15/651,548 to Sur., filed Jul. 17, 2017, which is incorporated herein by reference.

As described above, the aerosol delivery device of example implementations may include various electronic components in the context of an electronic cigarette, heat-not-burn device or no-heat-no-burn device, or even in the case of a device that includes the functionality of one or more of an electronic cigarette, heat-not-burn device or no-heat-no-burn device. FIG. 9 illustrates a circuit diagram of an aerosol delivery device 900 that may be or incorporate functionality of any one or more of aerosol delivery devices 100, 300, 700 according to various example implementations of the present disclosure.

As shown in FIG. 9, the aerosol delivery device 900 includes a control body 902 with a power source 904 and a control component 906 that may correspond to or include functionality of respective ones of the control body 102, 302, 702, power source 212, 524, 812, and control component 208, 522, 808. The aerosol delivery device also includes an aerosol production component 914 that may correspond to or include functionality of heating element 220, 532, or piezoelectric/piezomagnetic mesh of nozzle 820. The control body 902 may include the aerosol production component 914 or terminals 916 configured to connect the aerosol production component to the control body.

In some implementations, the control body 902 includes a sensor 908 configured to produce measurements of atmospheric air pressure in an air flow path through a housing 918. The sensor 908 may correspond to or include functionality of the flow sensor 210, 520 or input device 810, and the housing 918 may correspond to or include functionality of the housing 206, 516, 806. In these implementations, the control component 906 includes a switch 910 coupled to and between the power source 904 and the aerosol production component 914. The control component also includes processing circuitry 912 coupled to the sensor and the switch. In some further examples, the control body may include a second sensor configured to produce measurements of atmospheric air pressure in the air flow path through the housing, the second sensor acting as an additional reference for atmospheric air pressure.

In other implementations, the sensor 908 may be another type of pressure sensor. In one implementation, the sensor may be a pressure sensor including a moving membrane, a printed circuit board (PCB) and an application-specific integrated circuit (ASIC). The ASIC may include an analog output signal that indicates Whether there is an air flow. The pressure sensor may also detect the amount of the air flow. For example, the sensor may include a capacitive sensor that is connectable to or within the processing circuitry 912 to determine the amount of the air flow. The air flow may cause the membrane to move and the capacitive sensor may detect a change in capacitance and provide a signal to the processing circuitry, which measures the capacitance from the signal. The measured capacitance may be proportional to the air flow such that the signal output from the sensor may correspond to the amount of the air flow.

In another implementation, the sensor 908 may be an air flow sensor using thermopiles. In one example, this type of sensor may include two thermopiles and the aerosol production component 914. The detected air flow may cause a difference in temperature. The processing circuitry 912 may drive the aerosol production component and may read the analog temperature difference from the thermopiles and output an indication (e.g., a digital number) corresponding to the detected air flow. In a second example, the sensor may use the thermopiles to measure air flow using a thermo-transfer principle. In this second example, the sensor may include a thermal flow sensor die using thermocouples for temperature sensing instead of resistors. In another example, the sensor using thermopiles may measure air flow using a calorimetric principle. In this example, the sensor may use the thermopiles as temperature sensors instead of thermistors. A solid thermal isolation layer may be coated with various ceramic films to protect the thermopiles. In a further example, the sensor may include two clusters of thermocouples (e.g., 20 thermocouples), positioned symmetrically upstream and downstream of the aerosol production component. In this further example, the upstream thermocouples may be cooled by the air flow and the downstream thermocouples may be heated due to heat transfer from the aerosol production component in the flow direction. Thus, the output signal of the sensor may be the differential voltage of the upstream and downstream thermocouples. One example of an air flow sensor using thermopiles is described in U.S. Pat. No. 9,635,886 to Tu, which is incorporated herein by reference.

The thermal flow sensor die described in the above paragraph may, in some examples, be integrated with the processing circuitry 912. The thermal flow sensor die may output an analog voltage proportional to the puff of a user. An operational amplifier and an analog-to-digital converter (ADC) in the processing circuitry may convert the analog form to a digital form such as a digital number representing the detected air flow or the puff of the user. To integrate the thermal flow sensor die with the processing circuitry, in one example, the sensor 908 may be a microphone-based pressure sensor. The signal line of the microphone-based pressure sensor is connected to the processing circuitry. The ADC in the processing circuitry may convert the analog signal from the microphone-based pressure sensor to a digital signal (e.g., as a digital number representing the detected air flow or user puff).

In another implementation, the sensor 908 may be a waterproof pressure sensor. In one example, the sensor may be a microphone-based pressure sensor similar to the example described above. The waterproof level of the sensor may be IPX7 such that the sensor may be able to withstand immersion in water up to 1 meter for up to 30 minutes.

In another implementation, the sensor 908 may be an MEMS-based pressure sensor connectable to the processing circuitry 912. In one example, the sensor may use an auto-zero function to set auto-zero by loading the present ambient pressure as a zero reference. In this example, barometric pressure may be filtered using the auto-zero function. In another example, an output of the sensor may be interrupted after a pressure threshold is reached. One example of a MEMS-based pressure sensor is described in U.S. Pat. Appl. Pub. No. 2016/0128389 to Lamb et al., which is incorporated herein by reference. Examples of other suitable pressure sensors are described in U.S. Pat. Appl. Pub. No. 2018/0140009 to Sur et al., which is incorporated herein by reference.

In some implementations, the processing circuitry 912 is configured to determine a difference between the measurements of atmospheric air pressure from the sensor 908, and a reference atmospheric air pressure. In these implementations, only when the difference is at least a threshold difference, the processing circuitry is configured to output a signal (as indicated by arrow 920) to cause the switch 910 to switchably connect and disconnect an output voltage from the power source 904 to the aerosol production component 914 to power the aerosol production component for an aerosol-production time period. In some implementations, the switch is caused to switchably connect and disconnect the output voltage to adjust power provided to the aerosol production component to a power target (e.g., a power set point) that is variable according to a predetermined relationship between the difference and the power target. In these implementations, the predetermined relationship is described by a step function, a linear function, a non-linear function, or a combination thereof.

In some implementations, the processing circuitry 912 is configured to output a pulse width modulation (PWM) signal. A duty cycle of the PWM signal is adjustable to thereby adjust the power provided to the aerosol production component.

In some implementations, the threshold difference is set to reflect a minimum deviation from the reference atmospheric air pressure caused by a puff action of using the aerosol delivery device 900 by a user. In these implementations, the processing circuitry 912 is configured to output the signal to power the aerosol production component 914 for the aerosol-production time period that is coextensive with the puff action.

When outside the aerosol-production time period, in some implementations, the signal output from the processing circuitry 912 is absent and the output voltage from the power source 904 to the aerosol production component 914 is disconnected. In these implementations, the sensor 908 is configured to produce a measurement of ambient atmospheric air pressure to which the sensor is exposed. The processing circuitry is configured to set the reference atmospheric air pressure based on the measurement of ambient atmospheric air pressure.

When outside the aerosol-production time period, to set the reference atmospheric air pressure, in some implementations, the sensor 908 may periodically produce the measurement of ambient atmospheric air pressure to which the sensor is exposed. The processing circuitry 912 of some such implementations may periodically set the reference atmospheric air pressure based on the measurement of ambient atmospheric air pressure. In another example, the processing circuitry can be configured to periodically send a signal to the sensor to periodically read the measurement of ambient atmospheric air pressure produced by the sensor.

In some implementations, the processing circuitry 912 can be configured to set the reference atmospheric air pressure when triggered by an event. For example, the event may be insertion of a cartridge to the control body 902. In another example, the event may be a movement of the aerosol delivery device 900, and such movement may be detected by an accelerometer, gyroscope, and/or other sensor capable of sensing and/or quantifying motion of the aerosol delivery device. The movement of the aerosol delivery, device may indicate an upcoming usage of the aerosol delivery device. In these implementations, when the event is detected, the processing circuitry can set the reference atmospheric air pressure. When the event is not detected, the sensor 908 can be in quiescent current mode to save power. In a further example, if the cartridge is not inserted into the control body, the processing circuitry may not output a signal to cause the switch 910 to switchably connect and disconnect the output voltage to power the aerosol production component 914.

In some implementations, the processing circuitry 912 may be configured to detect a situational context of the aerosol delivery device 900 based on a detected reference atmospheric air pressure and/or based on a change in a series of two or more determined reference atmospheric air pressures and activate a control mode protocol corresponding to the detected situational context. The processing circuitry of some such implementations may be configured to determine that the aerosol delivery device is on an airplane and activate an aircraft mode control protocol.

As an example, in some implementations, a detected reference atmospheric air pressure may be compared to a threshold atmospheric air pressure indicative that the aerosol delivery device is at a flight altitude (e.g., at or above 28,000 feet in elevation). If the detected reference atmospheric air pressure is below the threshold indicative of flight altitude, the processing circuitry may determine that the aerosol delivery device is on an airplane and activate the aircraft mode control protocol. As another example, the processing circuitry of some implementations may compare a series of two or more determined reference atmospheric air pressures taken over a series of time and determine based on one or more of a magnitude in change between the series of reference atmospheric air pressures or a rate of change in the series of reference atmospheric air pressures that the aerosol delivery device is on an airplane (e.g., based on an observed drop in the reference atmospheric air pressures as the altitude of the aerosol delivery device increases during takeoff of the airplane) and activate the aircraft mode control protocol.

The aircraft mode control protocol may, for example, include the processing circuitry performing one or more of the following operations to prevent activation of the aerosol production component 914 while the aerosol delivery device is on the airplane in flight: (1) not output a signal to cause the switch 910 to switchably connect and disconnect the output voltage to power the aerosol production component even if a detected difference between the a detected air pressure and a reference atmospheric air pressure is above a threshold indicative of a puff on the aerosol delivery device; (2) place the sensor 908 in a sleep mode in which it does not measure air pressure for purposes of detecting a puff.

The processing circuitry may, for example, be configured to disable the aircraft mode control protocol in response to a subsequent measured reference atmospheric air pressure being below the threshold indicative that the aerosol delivery device is at a flight altitude and/or based on a magnitude in change between a series of reference atmospheric air pressures or a rate of change in a series of reference atmospheric air pressures signaling a pressure increase indicative that, the airplane has landed (e.g., based on an observed magnitude or rate of increase in the reference atmospheric air pressures). It will be appreciated that additional or alternative contexts can be detected and other corresponding context-specific control protocols can be activated based on a measured reference atmospheric air pressure and/or an observed change of reference atmospheric air pressures in various embodiments. For example, in some implementations, the processing circuitry may be configured to detect that the aerosol delivery device is in a submerged environment, such as on a submarine based on a change in a reference atmospheric air pressure after the submarine has submerged.

The aerosol production component 914 may be controlled in a number of different manners, including via the power provided to the aerosol production component during the aerosol-production time period. In some implementations, at a periodic rate during the aerosol-production time period, the processing circuitry 912 is configured to determine a sample window of measurements of instantaneous actual power provided to the aerosol production component. Each measurement of the sample window of measurements may be determined as a product of a voltage at and a current through the aerosol production component. The processing circuitry of such implementations may be further configured to calculate a moving average power provided to the aerosol production component based on the sample window of measurements of instantaneous actual power. In such implementations, the processing circuitry may be further configured to compare the moving average power to a power target, and output the signal to cause the switch to respectively disconnect and connect the output voltage at each instance in which the moving average power is respectively above or below the power target.

In one example, the processing circuitry 912 can determine the actual voltage (V) and current (I) through the aerosol production component 914. The processing circuitry can read the determined voltage and current values from analog to digital converter (ADC) inputs of the processing circuitry and determine an instantaneous "actual" power (I*V) directed to the aerosol production component. In some instances, such an "instantaneous" power measurement may be added to a sample window or moving window of values (i.e., other instantaneous power measurements) and then a moving average power of the sample window may be calculated, for example, according to the equation, $P_{avg}=P_{sample}+P_{avg}^{-1}/\text{WindowSize}$ in some aspects, for example, the window size may be between about 20 and about 256 samples.

In some examples, the processing circuitry 912 may then compare the calculated moving average power to a power target. The power target can be a selected power target associated with the power source 904 (e.g., a power level or current output from the power source regulated by the processing circuitry 912, or other regulating component associated therewith and disposed in electrical communication between the power source and the aerosol production component 914).

In some examples, (1) if $P_{ave}$ (the actual power determined at the aerosol production component 914) is below the selected power target (the average power), the switch 910 is turned on so as to allow current flow from the power source 904 to the aerosol production component (2) if $P_{ave}$ is above the selected power target, the switch is turned off so as to prevent current flow from the power source to the aerosol production component; and (3) steps 1 and 2 are repeated until expiration or cessation of the aerosol-production time period. More particularly, during the aerosol-production time period, the determination and calculation of the actual power at the aerosol production component, the comparison of the actual power to the pre-selected power target, and ON/OFF decisions for the switch to adjust the pre-selected power target may be substantially continuously performed by the processing circuitry 912 at a periodic rate, for example, of between about 20 and 50 times per second, so as to ensure a more stable and accurate average power directed to and delivered at the aerosol production component. Various examples of controlling the switch based on the actual power determined at the aerosol production component ($P_{ave}$) are described in U.S. Pat. No. 9,423,152 to Ampolini et al., which is incorporated herein by reference.

FIG. 10 illustrates a circuit diagram of components of an aerosol delivery device including the power source 904, the sensor 908, the switch 910, a processing circuitry 1000 and an aerosol production component 1006, according to example implementations of the present disclosure. The processing circuitry 1000 and aerosol production component 1006 may correspond to respectively the processing circuitry 912 and aerosol production component 914. As shown, in some implementations, the sensor is configured to produce measurements of atmospheric air pressure in an air flow path through the housing 918. In these implementations, a protection circuit 1010 may be coupled to the power source to provide overcurrent protection to the power source. The sensor may be connected to the processing circuitry 1001) via a digital serial communication link, e.g., using inter-integrated circuit (I2C) protocols. In one example, the data provided by the sensor may be an absolute atmospheric air pressure. In another example, the sensor may include a detection circuit that can interrupt the processing circuitry from a low power state when there is a significant change of atmospheric air pressure or the processing circuitry continuously polls the sensor for air pressure information on a periodic basis. One example of a suitable sensor is the BMP388 pressure sensor from Bosch Sensortec GmbH.

In some implementations, the processing circuitry 1000 can determine a difference between the measurements of atmospheric air pressure from the sensor 908, and a reference atmospheric air pressure. Only when the difference is at least a threshold difference, the processing circuitry can output a signal to cause the switch 910 to switchably connect and disconnect the output voltage to the aerosol production component 1006 to power the aerosol production component for an aerosol-production time period. The switch can be a Metal Oxide Semiconductor Field Effect Transistor (MOSFET) switch. In one example, the signal can be a PWM signal, as indicated by arrow 1008. A duty cycle of the PWM signal can be adjustable to thereby adjust the power provided to the aerosol production component.

In some implementations, a reference atmospheric air pressure may be established to prevent false detection of a puff in instances where the device 900 may experience changes in atmospheric air pressure such as car window rolling down while driving, a door shutting inside a sealed room, changes in elevation, or any other means by which the atmospheric air pressure of the device may experience changes. Changes in elevation may include elevator rides, aircraft flight, stairs, escalators, and travel over varied terrain. Various methods that can be utilized to account for such changes include: using a separate sense line to establish atmospheric air pressure; using a secondary sensor that reads atmospheric air pressure; and/or sampling the sensor 908 between puffs to determine the reference point.

In some examples, an algorithm that may use a rolling buffer of measurements from the sensor 908 to account for changes in atmospheric air pressure. In some of these examples, the processing circuitry 912 may use the rolling buffer of measurements to determine an average of the measurements and set the reference atmospheric air pressure to the average. In this regard, the average of the measurements is an atmospheric air pressure taken as representative of the atmospheric air pressures in the measurements from the sensor. In some examples, the average may be the arithmetic mean of the sample measurements. In other examples, the average may be the geometric mean, harmonic mean, median, mode or mid-range of the measurements.

In some examples, the processing circuitry 1000 may determine a difference between a most-recent of the measurements from the sensor 908 and the reference atmospheric air pressure, and if the difference is at least the threshold difference. The processing circuitry may also determine a rate of change of the atmospheric air pressure from at least some of the measurements atmospheric air pressure, and if the difference is caused by the puff action based on the rate of change. The processing circuitry may then output the signal to cause the switch 910 to switchably connect and disconnect the output voltage to the aerosol production component 1006 only when the difference is at least the threshold difference and is caused by the puff action. This may be used to not only prevent false detection of a puff, but may also allow the user to experience the device under normal operating experiences during transitions in atmospheric air pressure.

In some implementations, the processing circuitry 1000 may include two ADC components 1002 and 1004. In these implementations, the ADC component 1002 can measure the current $I_{APC}$ flowing through the aerosol production component (APC) 914, and the ADC component 1004 can measure the voltage $V_{APC}$ of the aerosol production component. Based on the measurements, the processing circuitry can determine the power provided by the power source 904 to the aerosol production component and can output a signal to control the switch 910 to adjust the power provided to the aerosol production component, as described above.

FIG. 11 illustrates a flowchart of a method 1100 of power control for the aerosol delivery device 900 according to example implementations of the present disclosure. In some implementations, as shown, at block 1102, the processing circuitry 912 can set the reference atmospheric air pressure. In one example, during a non-puff idle operation, the processing circuitry may periodically read the measured atmospheric air pressure from the sensor 908 to set the reference atmospheric air pressure. This process may be performed periodically to ensure that the reference atmospheric air pressure be updated due to changes to atmospheric air pressure. For example, the atmospheric air pressure may change when the aerosol delivery device changes in elevation. At block 1104, the processing circuitry 912 can determine if an activation event for power control has occurred. In one example, each new pressure reading is compared to the reference atmospheric air pressure to determine if an activation event has occurred. In some implementations, inadvertent activation or false trigger avoidance can be achieved by time and pressure discrimination. For example, small or short duration pressure changes may occur due to events such as closing a car door or while the aerosol delivery device is moving up or down on an elevator. Events may need to meet specific time and pressure thresholds to determine whether the power control for the aerosol delivery device will be activated or whether the new pressure readings will be used to update the reference atmospheric air pressure to reflect changing atmospheric conditions. If an activation event is detected at block 1104, the method 1100 may proceed from block 1104 to block 1106. Otherwise, the method 1100 may proceed from block 1104 to block 1102 to update the reference atmospheric air pressure.

At block 1106, the processing circuitry 912 can perform system checks. In some implementations, the processing circuitry may perform system checks to determine whether power should be delivered to the aerosol production component 914. For example, the system checks may include, but are not limited to: accumulated energy deposition checks in the aerosol production component, battery health and resistance of the aerosol production component. In one example, if the system checks detect an error, the processing circuitry 912 may enter an error state. In this example, the method 1100 may proceed from block 1106 to block 1116.

If the system checks detect no error, the method 1100 may proceed from block 1106 to block 1108. In some implementations in which the aerosol production component 914 corresponds to or includes functionality of heating element 220, 532, at block 1108, the aerosol production component can be pre-heated to a pre-determined level by delivering a constant power for a fixed amount of time from the power source 904 to the aerosol production component. It will be appreciated that pre-heating of the aerosol production component may also be performed by heating for a pre-determined time at a variable power level based on temperature of the aerosol production component at the outset of a puff. For example, pre-heating would involve targeting a set temperature, but the power level and/or pre-heat time would be reduced if the aerosol production component was already at a high temperature, such as in the case of a puff closely spaced with a prior puff. The method 1100 may proceed from block 1108 to block 1110. In one example, at block 1110, if the processing circuitry 912 detects an excessive temperature rise in the aerosol production component during the pre-heating, e.g., end of life (EOL) detected, the processing circuitry may enter an error state. In this example, the method 1100 may proceed from block 1110 to block 1116. On the other hand, if EOL is not detected, the method 1100 may proceed from block 1110 to block 1112.

In other examples, pre-heating involves sending a variable power level to the aerosol production component 914 upon detection of a puff. The variable power level may be a signal pulse of fractional size for both duration and signal strength. The processing circuitry 912 can calculate a starting temperature of the aerosol production component, and using this starting temperature, the processing circuitry can calculate an amount of energy needed to effectively bring the aerosol production component to the set temperature quickly to start generating aerosol. When the aerosol production component is at the starting temperature, the pre-heating may be considered to be at a state where the power level is at a maximum and at a maximum time of pre-heat. As the aerosol production component approaches the set temperature, the pre-heating may be considered to be at a state where the power level is at a level for producing a desired amount of aerosol and at a minimum time of pre-heat.

In some implementations, a predetermined relationship between pre-heating energy (shown in Joules for example) and aerosol production component temperature can be described by a linear function. In one example as shown in FIG. 12A, at point A, the pre-heating energy is at a maximum and the aerosol production component temperature is at a minimum. From point A to point B, the pre-heating energy may vary linearly with the aerosol production component temperature. At point B, the aerosol production component temperature reaches a temperature at which aerosol starts to be produced, pre-heating may cease. From point B to point C, the aerosol production component temperature may continue to increase due to control of the aerosol production component to continue to produce the aerosol as part of operation of the aerosol delivery device 900 outside of pre-heating. At point C, the aerosol production component temperature reaches a maximum.

In some implementations, the predetermined relationship can be described as a non-linear function. In one example as shown in FIG. 12B, the points A, B, and C are substantially similar to the example of FIG. 12A. In FIG. 12B, however, the energy for pre-heat may vary non-linearly with the aerosol production component temperature from point A to point B.

The temperature of the aerosol production component 914 (e.g., heating element 220, 532) may be measured, determined or calculated in any of a number of different manners. In various examples, the temperature may be measured, determined or calculated using a resistance temperature detector (RTD), thermistor, thermocouple, infrared (IR) temperature sensor or the like. Additionally or alternatively, the processing circuitry 912 may estimate the temperature based on the temperature of the aerosol production component following a prior puff, and a known rate at which heat is be removed from the aerosol production component by natural convection.

In some examples in which the aerosol delivery device 900 includes a RTD to measure temperature, the RTD may be separate from or integrated with the aerosol production component. The RTD has a resistance that is variable and proportional to the temperature of the aerosol production component, and a temperature coefficient of resistance (TCR) that is invariable with respect to the temperature. In these examples, the processing circuitry 912 may calculate the resistance such as from measurements of voltage across and current through the aerosol production component (R=V/I), and calculate the temperature of the aerosol production component from the resistance and TCR. For more information on examples of suitable resistance temperature detection, see U.S. Pat. Pub. No. 2018/0132526 to Davis et al., which is incorporated herein by reference. More information on examples of suitable IR temperature detection may be found in U.S. patent application Ser. No. 16/593,454 to Sur, filed Oct. 4, 2019, which is also incorporated herein by reference.

Returning to FIG. 11, in some implementations, at block 1112, the processing circuitry 912 can compare the current atmospheric air pressure measured by the sensor 908 with the reference atmospheric air pressure, and adjust power provided to the aerosol production component 914 accordingly, as described above. The method 1100 may proceed from block 1112 to block 1114. In one example, at block 1114, the sensor reading may return to the reference atmospheric air pressure if a maximum puff length is reached or the puff action is ended. In another example, at block 1114, the processing circuitry 912 can detect that the energy deposition limit of the aerosol production component 914 has been exceeded.

In this example, the processing circuitry 912 may enter an error state and the method 1100 may proceed from block 1114 to block 1116. On the other hand, if the maximum puff length is not reached, the puff action is not ended or energy deposition error is not detected, the method 1100 may proceed from block 1114 to block 1112 to continue adjust power provided to the aerosol production component. In one example, power adjustments may be repeated periodically to provide an appropriate power level to the aerosol production component. In one example, once the appropriate power level is set for the aerosol production component, the power level may be maintained when the aerosol delivery device 900 operates in a normal state.

FIG. 13 illustrates a flowchart of a method 1300 of power control for the aerosol delivery device 900 according to example implementations of the present disclosure. In some implementations, as shown at block 1302, the sensor 908 is inactive until a cartridge/aerosol source member is attached to a control body and ready to use in order to save power consumption. After cartridge/aerosol source member attachment has been detected, a buffer such as a first-in-first-out (FIFO) buffer may be filled with measurements from sensor, as shown at block 1304, and the reference atmospheric air pressure (or baseline) may be set to an average of the measurements. Next, periodic sampling of the sensor may be performed as shown at block 1306, the rate of change and the difference of the sensor sample and the baseline may be used to determine if a puff is coming, and as shown at block 1308 (e.g., activation detected). If a puff is not coming, then the sample may be added to buffer, a new average taken, and the baseline re-established, as shown at block 1310. In some examples the cartridge may include the aerosol production component 914. Or the control body may include the aerosol production component.

At block 1312, system checks may be performed to determine errors, which may include: not enough energy in the power source 904 for puff, overheating, cartridge/aerosol source member dry out, and/or too high of energy deposition. As shown at block 1314, various measurements may be performed including: measure voltage of the aerosol production component 914, measure current of the aerosol production component, read temperature of the aerosol production component, calculate temperature of the aerosol production component, sample pressure of the sensor 908 for change in user draw rate, and/or adjust power based on user change from the sensor.

Next, the method 1300 may proceed to block 1316 to determine if a puff is ending from either a user stopping or a maximum time allowed for the puff being reached. As shown at block 1318, error handling may be based on the error that is flagged. In some instances, the error may be in place to simply prevent the puff from occurring, and in those cases the device may resume sampling of the sensor 908.

As described above, in some implementations, the processing circuitry 912 may determine a difference between the measurements of atmospheric air pressure from the sensor 908 and the reference atmospheric air pressure. In these implementations, the processing circuitry can control the switch 910 and adjust power provided to the aerosol production component 914 to a power target that is variable according to a predetermined relationship between the difference and the power target. FIGS. 14A, 14B, 14C, 14D, 14E, and 14F illustrate different predetermined relationships between the difference and the power target according to example implementations of the present disclosure.

Figure 14A:
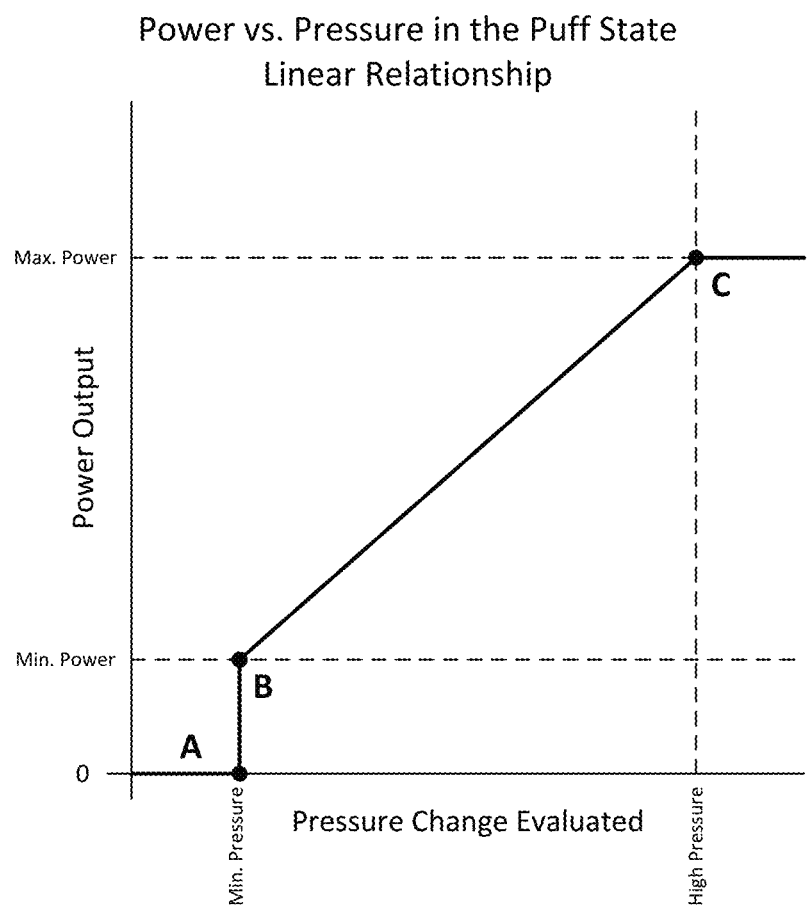

In some implementations, the predetermined relationship can be described by a linear function. In one example as shown in FIG. 14A, in region A, the difference between the measurements of atmospheric air pressure from the sensor 908 and the reference atmospheric air pressure is not significant enough to indicate that a puff action occurs. The power provided to the aerosol production component 914 may remain at 0 Watt. At point B, the difference reaches a threshold difference (indicated as "Min. Pressure" in FIG. 14A), which may indicate that a puff action occurs. In one example, at point B, a constant power can be provided to pre-heat the aerosol production component (indicated as "Min. Power" in FIG. 14A). In another example, the constant power may be different from the "Min. Power" indicated in FIG. 14A. From point B to point C, the power provided to the aerosol production component from the power source 904 may vary linearly with the pressure change (the difference between the measurements of atmospheric air pressure and the reference atmospheric air pressure). Higher pressure change may result in higher power provided to aerosol production component up to a point (indicated as "High Pressure" in FIG. 14A) where the provided power is limited to a value (indicated as "Max. Power" in FIG. 14A).

Figure 14B:
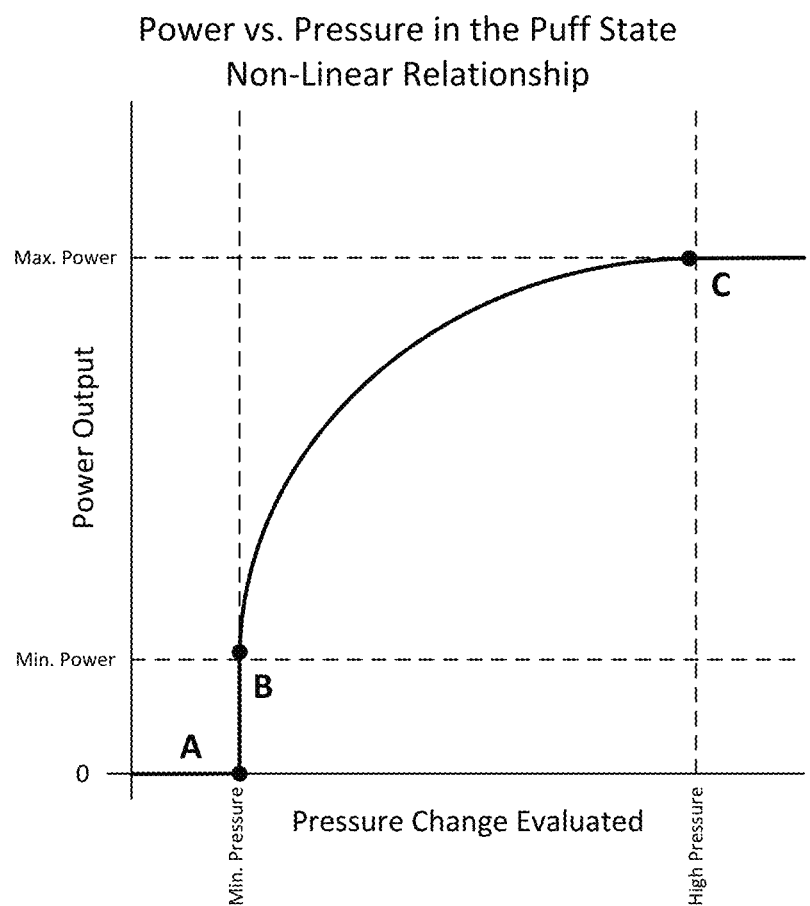

In some implementations, the predetermined relationship can be described by a non-linear function. In one example as shown in FIG. 14B, in region A, the difference between the measurements of atmospheric air pressure from the sensor 908 and the reference atmospheric air pressure is not significant enough to indicate that a puff action occurs. The power provided to the aerosol production component 914 may remain at 0 Watt. At point B, the difference reaches a threshold difference (indicated as "Min. Pressure" in FIG. 14B), which may indicate that a puff action occurs. In one example, at point B, a constant power can be provided to pre-heat the aerosol production component (indicated as "Min. Power" in FIG. 14B). In another example, the constant power may be different from the "Min. Power" indicated in FIG. 14B. From point B to point C, the power provided to the aerosol production component from the power source 904 may vary non-linearly with the pressure change. Higher pressure change may result in higher power provided to aerosol production component up to a point (indicated as "High Pressure" in FIG. 14B) where the provided power is limited to a value (indicated as "Max. Power" in FIG. 14B).

Figure 14C:
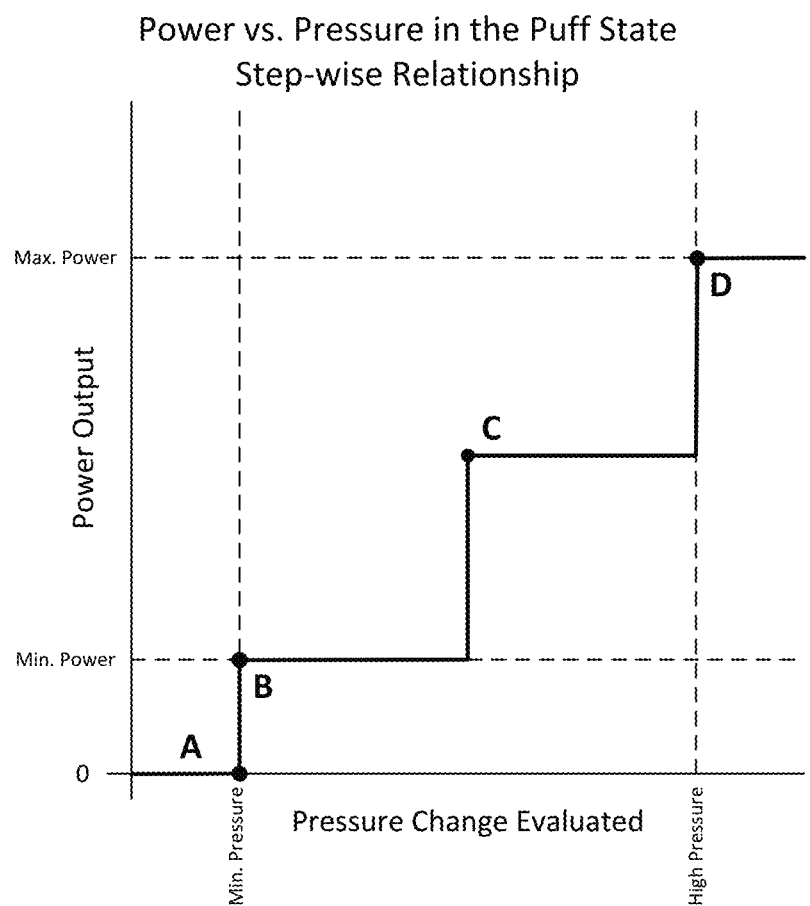

In some implementations, the predetermined relationship can be described by a step-wise function. In one example as shown in FIG. 14C, in region A, the difference between the measurements of atmospheric air pressure from the sensor 908 and the reference atmospheric air pressure is not significant enough to indicate that a puff action occurs. The power provided to the aerosol production component 914 may remain at 0 Watt. At point 9, the difference reaches a threshold difference (indicated as "Min. Pressure" in FIG. 14C), which may indicate that a puff action occurs. In one example, at point B, a constant power can be provided to pre-heat the aerosol production component (indicated as "Min. Power" in FIG. 14C). In another example, the constant power may be different form the "Min. Power" indicated in FIG. 14C. From point B to region C, the power provided to the aerosol production component from the power source 904 may vary in power steps with non-continuous pressure changes. Higher pressure change may result in higher power provided to aerosol production component up to a point (indicated as "High Pressure" in FIG. 14C) where the provided power is limited to a value (indicated as "Max. Power" in FIG. 14C). In one example, step sizes of the power steps and pressure level correlations relating pressure to output power may be determined by the manufacturer of the aerosol delivery device 900 or the processing circuitry 912. In another example, a user may define the step sizes of the power steps such as by providing user input to the processing circuitry.

Figure 14D:
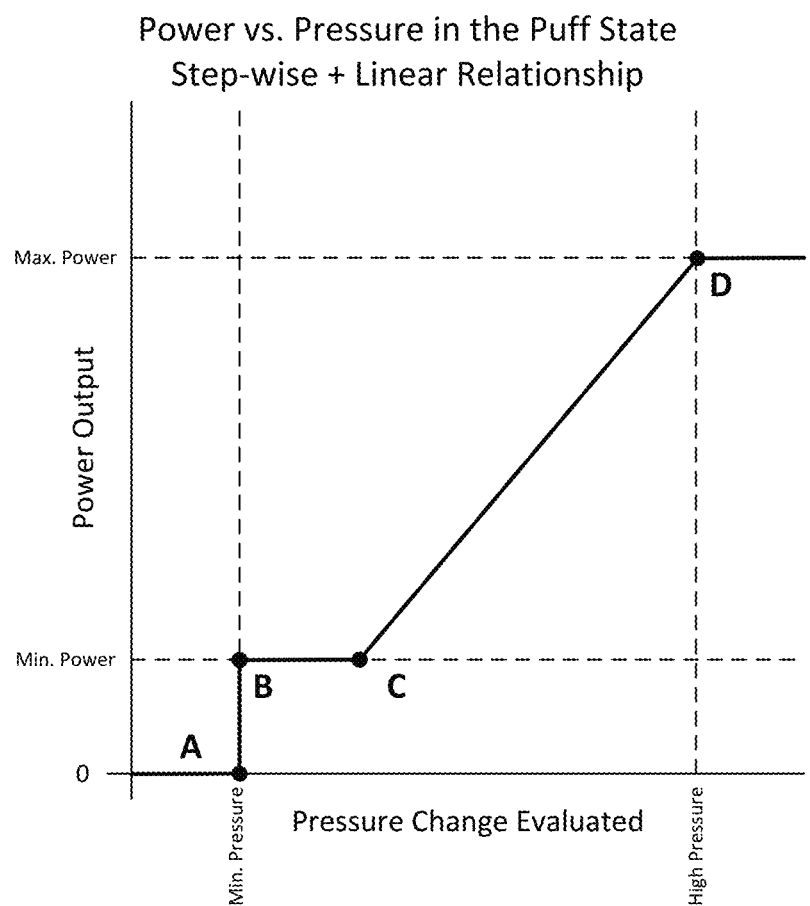

In some implementations, the predetermined relationship can be described by a combination of two or more of a linear function, a non-linear function and a step function. In one example as shown in FIG. 14D, the predetermined relationship can be described by a step-linear function, i.e., a combination of a step function and a linear function. As shown, in region A, the difference between the measurements of atmospheric air pressure from the sensor 908 and the reference atmospheric air pressure is not significant enough to indicate that a puff action occurs. The power provided to the aerosol production component 914 may remain at 0 Watt. At point B, the difference reaches a threshold difference (indicated as "Min. Pressure" in FIG. 14D), which may indicate that a puff action occurs. In one example, at point B, a constant power can be provided to pre-heat the aerosol production component (indicated as "Min. Power" in FIG. 14D). In another example, the constant power may be different from the "Min. Power" indicated in FIG. 14D. From point B to point C, the power provided to the aerosol production component from the power source 904 may remain constant until the pressure change reaches a level (indicated as "Medium Pressure" in FIG. 14D), From point C to point D, the power provided to the aerosol production component may vary linearly with the pressure change. Higher pressure change may result in higher power provided to aerosol production component up to a point (indicated as "High Pressure" in Ha 14D) where the provided power is limited to a value (indicated as "Max. Power" in FIG. 14D).

Figure 14E:
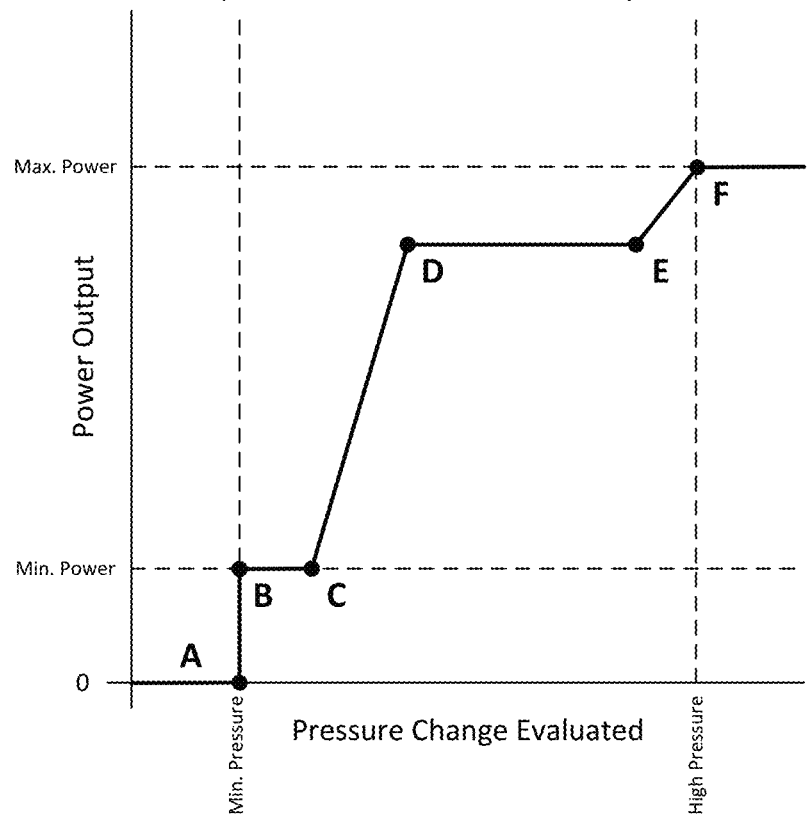

In another example, as shown FIG. 14E, the predetermined relationship can be described by another combination of a step function and a linear function. As shown, region A, point 13, and point C are similar to the example of FIG. 14D. From point C to point D, the power provided to the aerosol production component may vary linearly with the pressure change. Then, from point D to point E, the power provided to the aerosol production component from the power source 904 may remain constant at a power level higher than from point B to point C. From point E to point F, the power provided to the aerosol production component may again vary linearly with the pressure change up to a point (indicated as "High Pressure" in FIG. 14E) where the provided power is limited to a value (indicated as "Max. Power" in FIG. 14E).

Figure 14F:
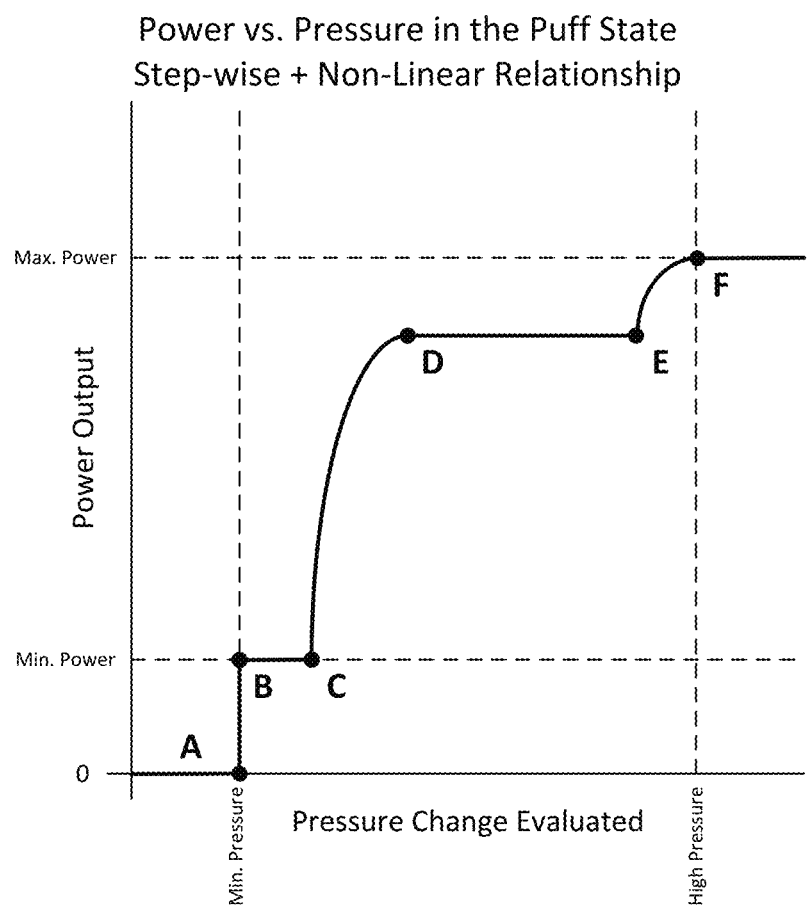

In yet another example, as shown in FIG. 14F, the predetermined relationship can be described by a combination of a step function and a non-linear function. The difference between the example of FIG. 14F compared to FIG. 14E, is that in FIG. 14F the power provided to the aerosol production component may vary non-linearly with the pressure change for the portions from point C to point D and from point E to point F.

FIGS. 14A-14F only illustrate some implementations of the predetermined relationship. In other implementations, the predetermined relationship can be described by different linear functions, different non-linear functions, different step functions or different combinations thereof.

The foregoing description of use of the article(s) can be applied to the various example implementations described herein through minor modifications, which can be apparent to the person of skill in the art in light of the further disclosure provided herein. The above description of use, however, is not intended to limit the use of the article but is provided to comply with all necessary requirements of disclosure of the present disclosure. Any of the elements shown in the article(s) illustrated in FIGS. 1-12 or as otherwise described above may be included in an aerosol delivery device according to the present disclosure.

Many modifications and other implementations of the disclosure will come to mind to one skilled in the art to which this disclosure pertains having the benefit of the teachings presented in the foregoing descriptions and the associated figures. Therefore, it is to be understood that the disclosure is not to be limited to the specific implementations disclosed herein and that modifications and other implementations are intended to be included within the scope of the appended claims, Although specific terms are employed herein, they are used in a generic and descriptive sense only and not for purposes of limitation.

What is claimed is:

1. An aerosol delivery device comprising:
   a power source configured to provide an output voltage;
   an aerosol production component powerable to produce an aerosol from an aerosol precursor composition;
   a sensor configured to produce measurements of atmospheric air pressure in an air flow path through at least a portion of the aerosol delivery device;
   a switch coupled to and between the power source and the aerosol production component; and
   processing circuitry coupled to the sensor and the switch, and configured to at least: determine a difference between the measurements of atmospheric air pressure from the sensor, and a reference atmospheric air pressure; and only when the difference is at least a threshold difference,
   output a signal to cause the switch to switchably connect and disconnect the output voltage to the aerosol production component to power the aerosol production component for an aerosol-production time period, the switch caused to switchably connect and disconnect the output voltage to adjust power provided to the aerosol production component to a power target that is variable according to a predetermined relationship between the difference and the power target,
   wherein the threshold difference is set to reflect a minimum deviation from the reference atmospheric air pressure caused by a puff action of using the aerosol delivery device by a user.

2. The aerosol delivery device of claim 1,
   wherein outside the aerosol-production time period in which the signal is absent and the output voltage to the aerosol production component is disconnected, the sensor is configured to produce measurements of ambient atmospheric air pressure to which the sensor is exposed, and the processing circuitry is configured to set the reference atmospheric air pressure based on the measurements of ambient atmospheric air pressure; and wherein the processing circuitry configured to set the reference atmospheric air pressure includes the processing circuitry further configured to determine an average of the measurements of ambient atmospheric air pressure and set the reference atmospheric air pressure to the average.

3. The aerosol delivery device of claim 1, wherein the processing circuitry configured to determine the difference and output the signal includes the processing circuitry configured to:

determine a difference between a most-recent of the measurements and the reference atmospheric air pressure, and if the difference is at least the threshold difference;

determine a rate of change of the atmospheric air pressure from at least some of the measurements atmospheric air pressure, and if the difference is caused by the puff action based on the rate of change; and output the signal only when the difference is at least the threshold difference and is caused by the puff action.

4. The aerosol delivery device of claim 1, wherein the processing circuitry configured to output the signal includes the processing circuitry configured to output the signal to power the aerosol production component for the aerosol-production time period that is coextensive with the puff action.

5. The aerosol delivery device of claim 2, wherein the predetermined relationship is described by a step function, a linear function, a non-linear function, or a combination thereof; and preferably wherein the predetermined relationship is described by a combination of a step function and a linear function.

6. The aerosol delivery device of claim 2, wherein one or more of the following conditions is met:

the aerosol precursor composition is a liquid, solid or semi-solid;

the processing circuitry configured to output the signal includes the processing circuitry configured to output a pulse width modulation (PWM) signal, and a duty cycle of the PWM signal is adjustable to thereby adjust the power provided to the aerosol production component;

at a periodic rate during the aerosol-production time period, the processing circuitry is further configured to: determine a sample window of measurements of instantaneous actual power provided to the aerosol production component, each measurement of the sample window of measurements determined as a product of a voltage at and a current through the aerosol production component; calculate a moving average power provided to the aerosol production component based on the sample window of measurements of instantaneous actual power;

compare the moving average power to the power target; and output the signal to cause the switch to respectively disconnect and connect the output voltage at each instance in which the moving average power is respectively above or below the power target.

7. A control body for an aerosol delivery device, the control body comprising:

a power source configured to provide an output voltage;

an aerosol production component or terminals configured to connect the aerosol production component to the control body, the aerosol production component powerable to produce an aerosol from an aerosol precursor composition;

a sensor configured to produce measurements of atmospheric air pressure in an air flow path through the control body;

a switch coupled to and between the power source and the aerosol production component; and processing circuitry coupled to the sensor and the switch, and configured to at least: determine a difference between the measurements of atmospheric air pressure from the sensor, and a reference atmospheric air pressure; and only when the difference is at least a threshold difference, output a signal to cause the switch to switchably connect and disconnect the output voltage to the aerosol production component to power the aerosol production component for an aerosol-production time period, the switch caused to switchably connect and disconnect the output voltage to adjust power provided to the aerosol production component to a power target that is variable according to a predetermined relationship between the difference and the power target, wherein the threshold difference is set to reflect a minimum deviation from the reference atmospheric air pressure caused by a puff action of using the aerosol delivery device by a user.

8. The control body of claim 7, wherein outside the aerosol-production time period in which the signal is absent and the output voltage to the aerosol production component is disconnected, the sensor is configured to produce measurements of ambient atmospheric air pressure to which the sensor is exposed, and the processing circuitry is configured to set the reference atmospheric air pressure based on the measurements of ambient atmospheric air pressure; and wherein the processing circuitry configured to set the reference atmospheric air pressure includes the processing circuitry further configured to determine an average of the measurements of ambient atmospheric air pressure and set the reference atmospheric air pressure to the average.

9. The control body of claim 7, wherein one of the following conditions is met:

the processing circuitry configured to determine the difference and output the signal includes the processing circuitry configured to: determine a difference between a most-recent of the measurements and the reference atmospheric air pressure, and if the difference is at least the threshold difference; determine a rate of change of the atmospheric air pressure from at least some of the measurements atmospheric air pressure, and if the difference is caused by the puff action based on the rate of change; and output the signal only when the difference is at least the threshold difference and is caused by the puff action; or the processing circuitry configured to output the signal includes the processing circuitry configured to output the signal to power the aerosol production component for the aerosol-production time period that is coextensive with the puff action.

10. The control body of claim 8, wherein the predetermined relationship is described by a step function, a linear function, a non-linear function, or a combination thereof.

11. The control body of claim 8, wherein the predetermined relationship is described by a combination of a step function and a linear function.

12. The control body of claim 7, wherein the aerosol precursor composition is a liquid, solid or semi-solid.

13. The control body of claim 7, wherein the processing circuitry configured to output the signal includes the processing circuitry configured to output a pulse width modulation (PWM) signal, and a duty cycle of the PWM signal is adjustable to thereby adjust the power provided to the aerosol production component.

14. The control body of claim 8, wherein at a periodic rate during the heating time period, the processing circuitry is further configured to:

determine a sample window of measurements of instantaneous actual power provided to the aerosol production component, each measurement of the sample window of measurements determined as a product of a voltage at and a current through the aerosol production component;

calculate a moving average power provided to the aerosol production component based on the sample window of measurements of instantaneous actual power;

compare the moving average power to the power target; and output the signal to cause the switch to respectively disconnect and connect the output voltage at each instance in which the moving average power is respectively above or below the power target.

\* \* \* \* \*